United States Patent
Langford et al.

(10) Patent No.: US 11,584,637 B2
(45) Date of Patent: Feb. 21, 2023

(54) HIERARCHICAL ASSEMBLY OF SELF-REPLICATING SPACECRAFT USING DISTRIBUTED MECHANISMS AND ACTUATION IN DIGITAL MATERIALS

(71) Applicant: Massachusetts Institute of Technology, Cambridge, MA (US)

(72) Inventors: William Kai Langford, Cambridge, MA (US); Amanda Ghassaei, Cambridge, MA (US); Neil Gershenfeld, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1218 days.

(21) Appl. No.: 16/109,947

(22) Filed: Aug. 23, 2018

(65) Prior Publication Data

US 2019/0077030 A1 Mar. 14, 2019

Related U.S. Application Data

(60) Provisional application No. 62/549,327, filed on Aug. 23, 2017.

(51) Int. Cl.
*B81B 7/00* (2006.01)
*B81B 3/00* (2006.01)
(Continued)

(52) U.S. Cl.
CPC .......... *B81B 7/0003* (2013.01); *B81B 3/0021* (2013.01); *B81C 1/00007* (2013.01);
(Continued)

(58) Field of Classification Search
CPC ... B81B 7/0003; B81B 3/002; B81B 2201/13; B81B 2207/07; B81C 1/00007;
(Continued)

(56) References Cited

U.S. PATENT DOCUMENTS

| 5,659,477 A * | 8/1997 | Collins ................... G16Z 99/00 700/95 |
| 8,834,666 B2 * | 9/2014 | Sreetharan .............. B32B 3/266 156/290 |
| 2014/0202628 A1 | 7/2014 | Sreetharan et al. |

FOREIGN PATENT DOCUMENTS

WO WO-2016179435 A1 * 11/2016 ............ B25J 9/0084

OTHER PUBLICATIONS

Langford et al., U.S. Appl. No. 15/031,545 entitled "Discrete Assemblers Utilizing Coventional Motion Systems", filed Apr. 22, 2016, 41 Pages.
(Continued)

*Primary Examiner* — Yasser A Abdelaziez
(74) *Attorney, Agent, or Firm* — Dunlap Bennett & Ludwig, PLLC

(57) ABSTRACT

A system of flexural, actuating, and semiconducting elements of part-types necessary to assemble actuated robotic systems. These parts are joined with a common interface, interlocking with neighboring parts to form a regular lattice structure. Primary considerations for the design of the part interfaces include ease of assembly and the ability to transfer mechanical loads and electronic signals to neighboring parts. The parts are designed to be assembled vertically so structures can he built incrementally one part at a time. They can be easily fabricated at a range of length-scales using a variety of two-dimensional manufacturing processes. These processes include, for example, stamping and laminating, which enable high-throughput production. The simple mechanical interfaces between parts also enable disassembly allowing for reconfigurability and reuse. The interlocking nature of these assemblies allows loads to be distributed through many parallel load-paths.

17 Claims, 23 Drawing Sheets

(51) Int. Cl.
*H02K 41/035* (2006.01)
*B81C 1/00* (2006.01)
*H02P 7/025* (2016.01)
*H02P 25/034* (2016.01)

(52) U.S. Cl.
CPC ...... *H02K 41/0354* (2013.01); *B81B 2201/13* (2013.01); *B81B 2207/07* (2013.01); *H02P 7/025* (2016.02); *H02P 25/034* (2016.02)

(58) Field of Classification Search
CPC . H02P 7/025; H02P 25/034; B25J 7/00; B25J 9/08; H02K 41/0354
See application file for complete search history.

(56) References Cited

OTHER PUBLICATIONS

Langford et al., U.S. Appl. No. 15/034,974 entitled "Self-Assembling Assemblers", filed May 6, 2016, 55 Pages.
Langford et al., U.S. Appl. No. 15/338,960 entitled "Self-Assembling Assemblers", filed Oct. 31, 2016, 52 Pages.
Langford et al., "Hierarchical Assembly of a Self-Replicating Spacecraft", IEEE Aerospace Conference, Mar. 2017, 10 Pages.

\* cited by examiner

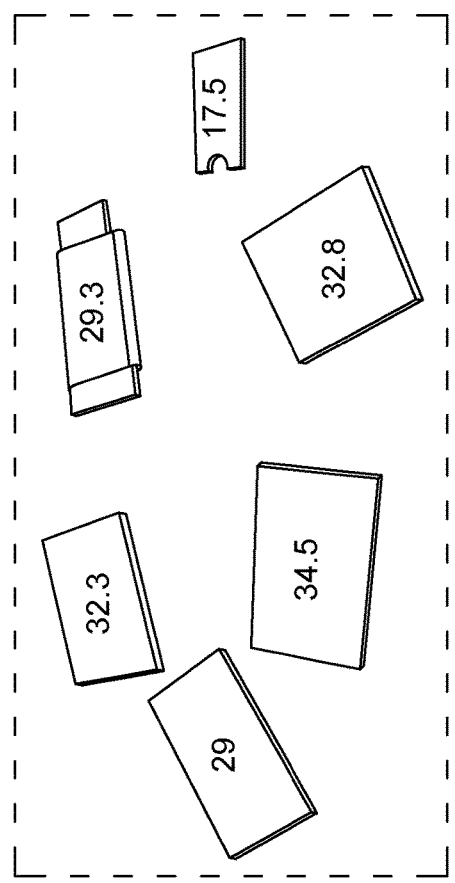
FIG. 15
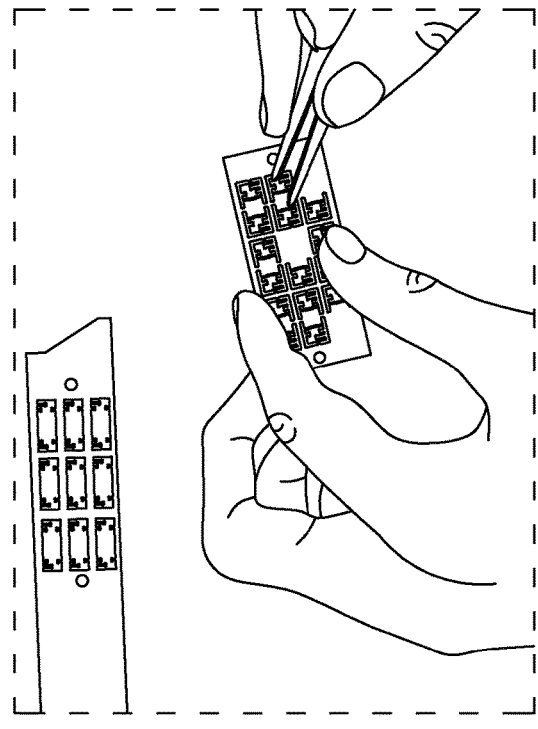
FIG. 16
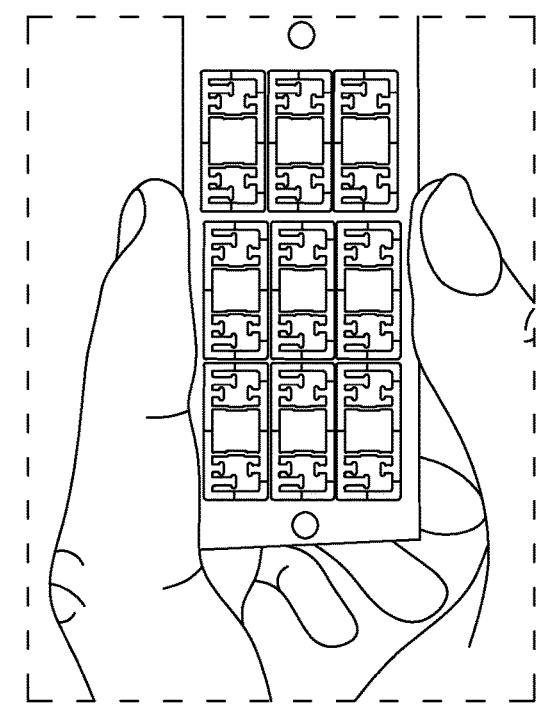

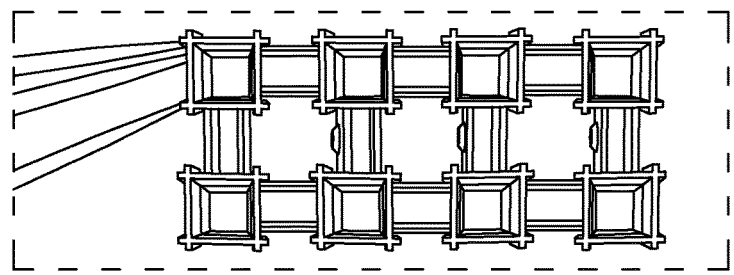
FIG. 49
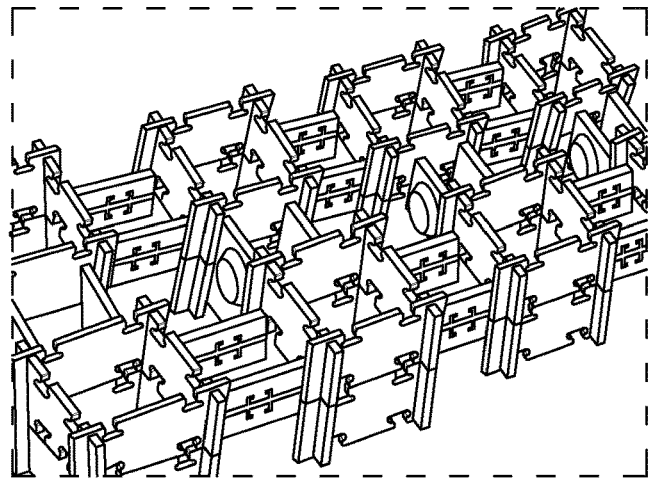
FIG. 50
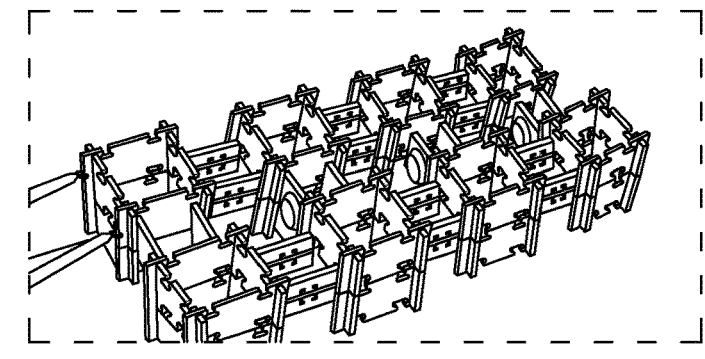
FIG. 51
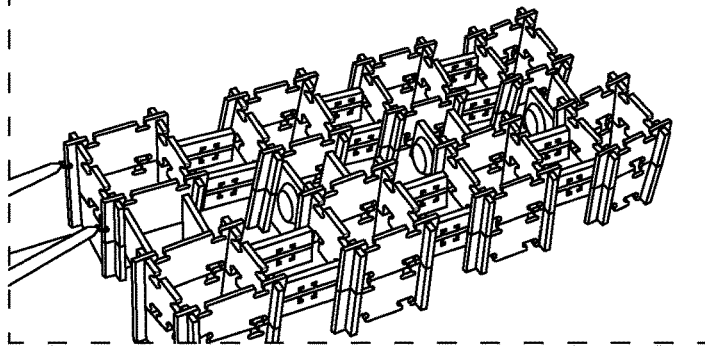

HIERARCHICAL ASSEMBLY OF SELF-REPLICATING SPACECRAFT USING DISTRIBUTED MECHANISMS AND ACTUATION IN DIGITAL MATERIALS

This application is related to, and claims priority from, U.S. Provisional Patent Application No. 62/549,327 filed Aug. 23, 2017. Application 62/549,327 is hereby incorporated by reference in its entirety. In addition, the publication: Langford et al., Hierarchical Assembly of a Self-Replicating Spacecraft© 2017 IEEE, filed as part of provisional application 62/549,327 is also incorporated by reference in its entirety.

This invention was made with Government support under contract numbers W911NF-16-1-0568 awarded by the Army Research Office, and 1344222 awarded by the National Science Foundation. The Government has certain rights in the invention.

BACKGROUND

Field of the Invention

The present invention relates generally to the field of machines and more particular to machines assembled from standardized function building blocks.

Description of the Problem

Extra-terrestrial fabrication of spacecraft by current best-practice manufacturing methods is complicated by the need to integrate thousands of unique parts, each made using a diversity of processes and raw materials. Reducing this complexity could enable exponential space exploration via self-replicating spacecraft (known as Von Neumann probes).

Many researchers see additive manufacturing as the most promising fabrication technique for space. There has been recent interest in 3D printing as a means of manufacturing spacecraft and their parts, both on- and off-Earth. This hopefulness, in large part, rests on the ability to print functional devices with a range of materials. While there is a great range of 3D printing techniques which work with a number of different materials, the processes are still generally restricted to a single material at a time: those that can print with multiple materials simultaneously are typically limited to printing polymers with a narrow range of material properties. While additive manufacturing capabilities will certainly be useful in developing off-Earth manufacturing work flows, they do not span the required material diversity and will need to be complemented with alternate manufacturing and assembly capabilities.

Modular robotics attempts to alleviate the problem of in-situ fabrication by standardizing parts and enabling a large number of identical modules to be reconfigured to suit a particular application. However, these robots have had little impact outside of the research lab. In their current form, they are not a cost-effective technology for space applications; each constituent module is made highly complex by the need to incorporate power, computation, networking, actuation, and control in a single unit. A branch of modular robotics which focuses on heterogeneous architectures with active agents and passive structural members may be most promising for space applications. These robots move on, or relative to, a lattice and are able to manipulate and build upon the environment that they move in.

The development of in-space manufacturing capabilities and modular robotics architectures are important steps towards self-replicating systems. Research in self-replicating hardware is in early stages, and most prior work addresses high-level system design challenges including hierarchy and scale as well as required ISRU capabilities and launch requirements for self-sustaining factories. Other prior work has looked at lower-level implementation details and established methods of creating self-replicating systems with macro-scale building blocks. Moses et al. built a universal constructor system, for example, using 18 part-types that is capable of assembling some of its own subsystems. However, the parts have a high-degree of embedded complexity, including conventional actuators and processors, which limits the use-fullness of such a system.

With the ability to self-replicate, comes the opportunity for a spacecraft, probe, or rover to reconfigure, repair or adapt itself to its environment. These abilities are desirable for the efficiency and flexibility of space exploration missions. Such missions include evaluating locations on Mars for future human settlement, searching moons within our solar system (including Europa for signs of life), and probing asteroids to test for material composition. Failure or errors can arise from unexpected landing configurations, such as when the Rosetta mission's Philae spacecraft landed incorrectly on an asteroid, resulting in its batteries running out after two days due to being unable to charge them with its solar panels. Numerous attempts have been made or proposed for reconfigurable spacecraft. Ferguson et al. proposed a transforming rover system with basic mechanisms capable of expanding, dividing, and reorienting.

In prior work by the present inventors, we have shown that with two single material part-types (conducting and insulating), it is possible to route arbitrary electrical traces through three dimensional volumes. Furthermore, with the addition of a resistive part-type, any passive electronic component (capacitors, inductors, and resistors) can be constructed through the geometric placement of parts. More recently, we have developed computer aided work-flows and robotics to automate the assembly of these. structures.

It would be extremely advantageous to have an approach that discretizes robotic systems at a much finer granularity than prior work in modular robotics and shows that complex systems can be assembled from a small set of functional part-types.

SUMMARY OF THE INVENTION

The present invention is a variant of a discrete assembly approach (described, for example, in U.S. patent application Ser. No. 15/031,545, entitled Discrete Assemblers Utilizing Conventional Motion Systems, U.S. patent application Ser. No. 15/034,974, entitled Self-Assembling Assemblers, and U.S. patent application Ser. No. 15/338,960, entitled Self-Assembling Assemblers). This invention allows one to embed mechanism, actuation, and circuitry in a single assembly architecture (and puts this work somewhere between modular robotics and digital materials).

The present invention extends previous work by introducing flexural, actuating, and semiconducting elements. We present those part-types necessary to assemble actuated robotic systems including an assembler made out of the parts it assembles. These parts are joined with a common interface, interlocking with neighboring parts to form a regular lattice structure. Primary considerations for the design of the part interfaces include ease of assembly and the ability to transfer mechanical loads and electronic signals to neighboring parts. The parts are designed to be assembled vertically so structures can he built incrementally one part at a time. They can be easily fabricated at a range of length-scales using a variety of two-dimensional manufacturing processes. These processes include, for example, stamping and laminating, which enable high-throughput production. The simple mechanical interfaces between parts also enable disassembly allowing for reconfigurability and reuse. Furthermore, the interlocking nature of these assemblies allows loads to be distributed through many parallel load-paths and means that the size of the assemblies is not limited by the strength of the individual parts.

DESCRIPTION OF THE FIGURES

Attention is now directed to several figures that illustrate features of the present invention.

FIG. 15 shows a series of experiments that were performed to determine a tape/material combination with adequate thickness, ultimately settling on using 0.0125" delrin with 6mil 3M 410M double-sided tape.

FIG. 16 shows parts being picked off with tweezers.

FIG. 49-FIG. 51 show operation of the Neopixels.

Several figures have been presented to aid in understanding the present invention. The scope of the present invention is not limited to what is shown in the figures.

DESCRIPTION OF THE PREFERRED EMBODIMENTS

The present invention relates to parts are joined with a common interface, interlocking with neighboring parts to form a regular lattice structure. The parts are designed to be assembled vertically so structures can he built incrementally one part at a time. They can be easily fabricated at a range of length-scales using a variety of two-dimensional manufacturing processes. The simple mechanical inter-faces between parts also enable disassembly, allowing for reconfigurability and reuse. Furthermore, the interlocking nature of these assemblies allows loads to be distributed through many parallel load-paths and means that the size of the assemblies is not limited by the strength of the individual parts.

Middle Out Machines

Middle Out Machines are machines assembled from standardized functional building blocks. The present description describes types of middle out machines and is divided into four main sections: Geometry, Mechanism, Actuation, and Circuitry.

Figure 1:
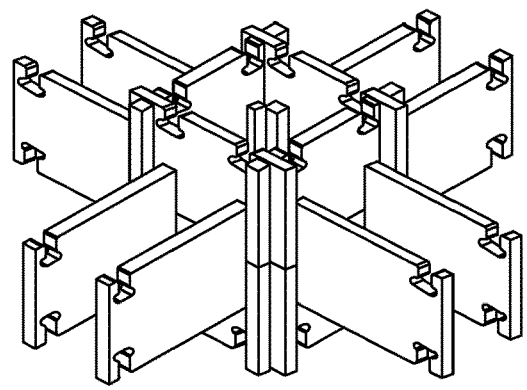
FIG. 1 shows an example geometry made from parts.
Figure 2:
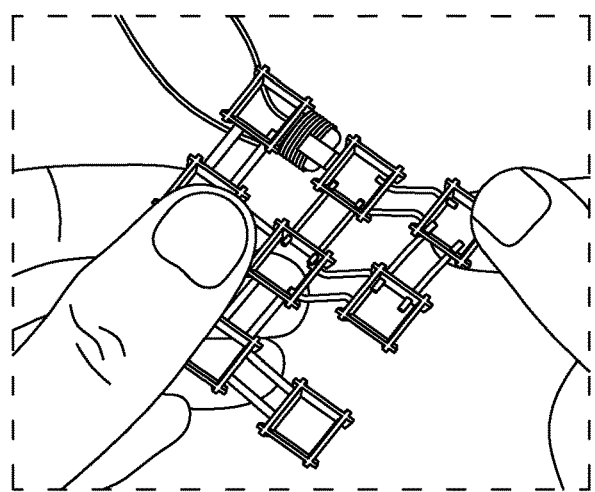
FIG. 2 shows design and modeling of actuator parts.
Figure 3:
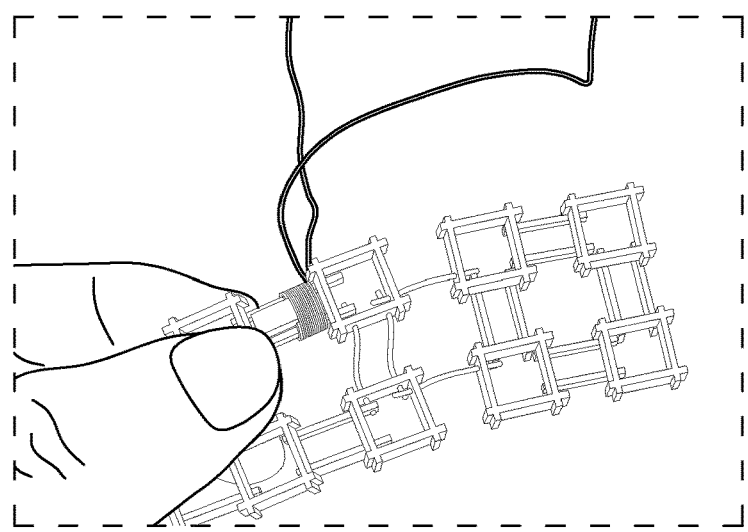
FIG. 3 shows mechanisms assembled from discrete parts.
Figure 4:
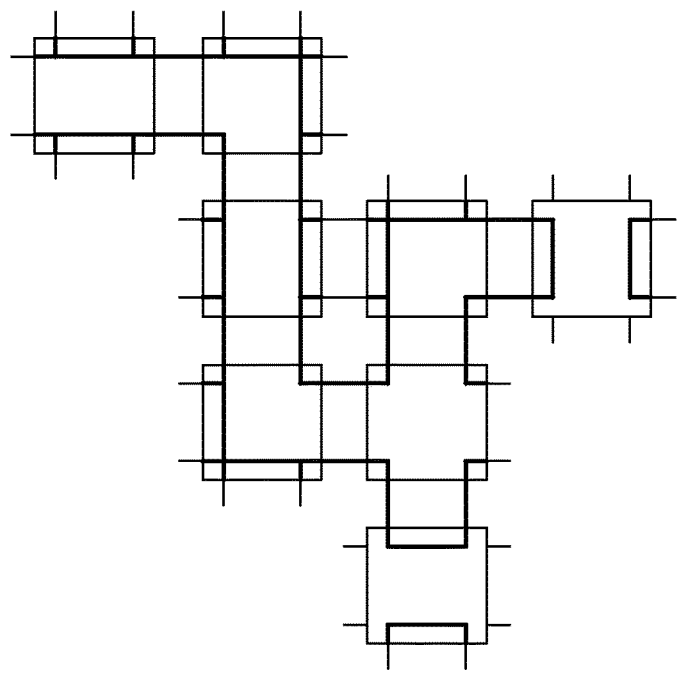
FIG. 4 shows experimenting with circuit and logic routing.

The geometry section includes images and documentation of experiments with the physical geometry of the building block parts, for example FIG. 1 shows an example geometry made from parts. The actuation section includes design, modeling, and physical testing of actuator parts such as those in FIG. 2. The mechanisms section contains design, fabrication, and testing of mechanisms assembled from discrete parts such as those shown in FIG. 3. The circuits section contains experimental studies of circuit and logic routing in this building block architecture such as those shown in FIG. 4.

Geometry

Figure 5:
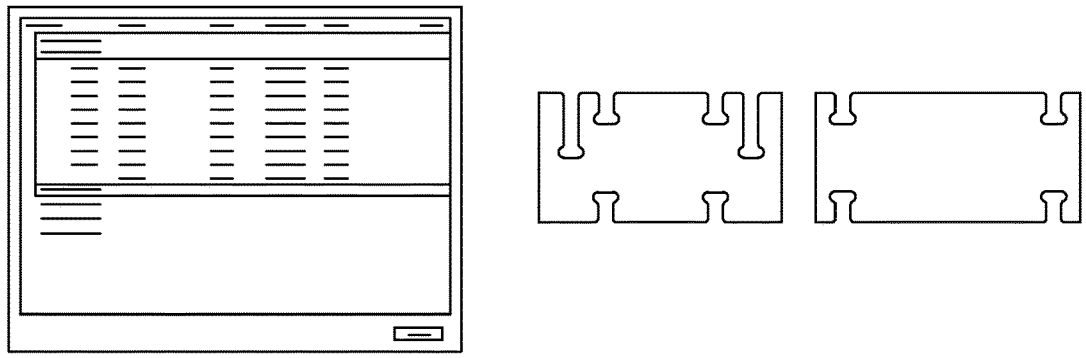
FIG. 5 shows an example of struts and nodes and of an assembly of both.
Figure 5:
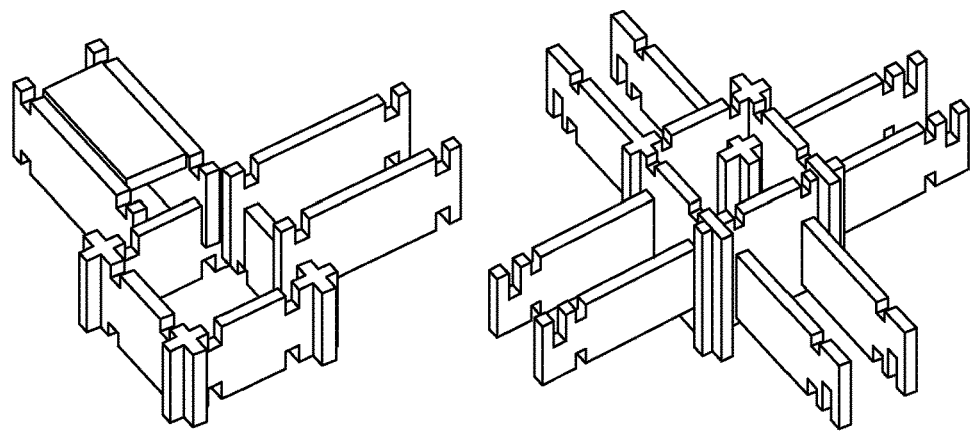
Figure 6:
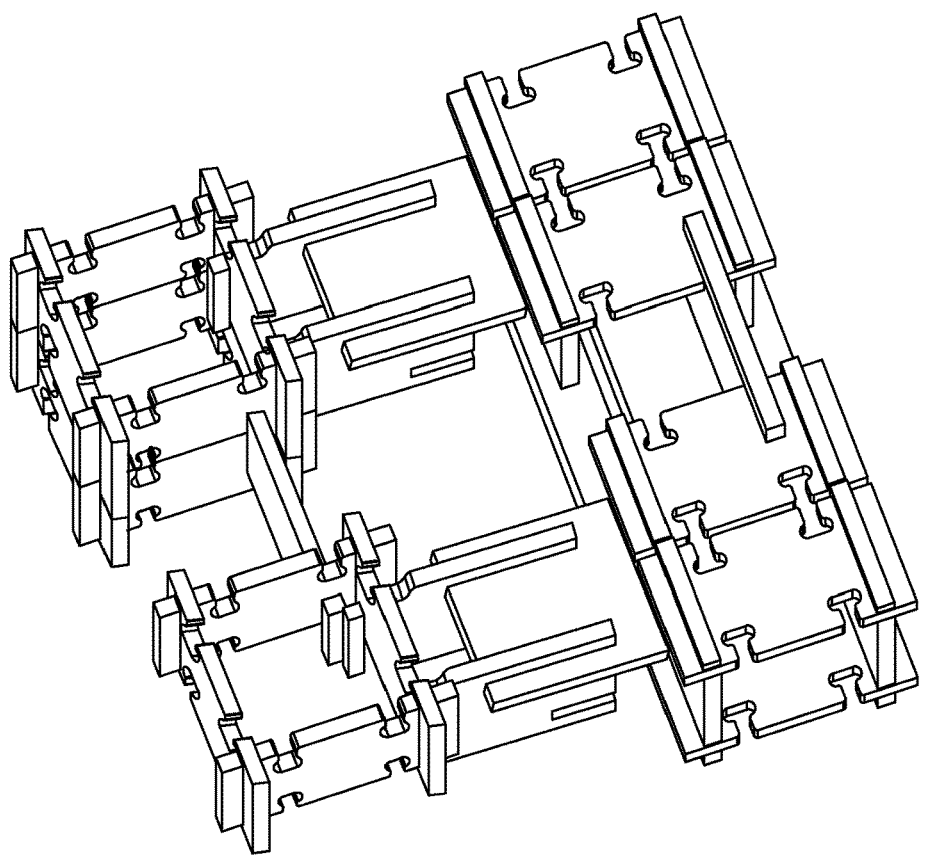
FIG. 6 shows another example of a structure.
Figure 7:
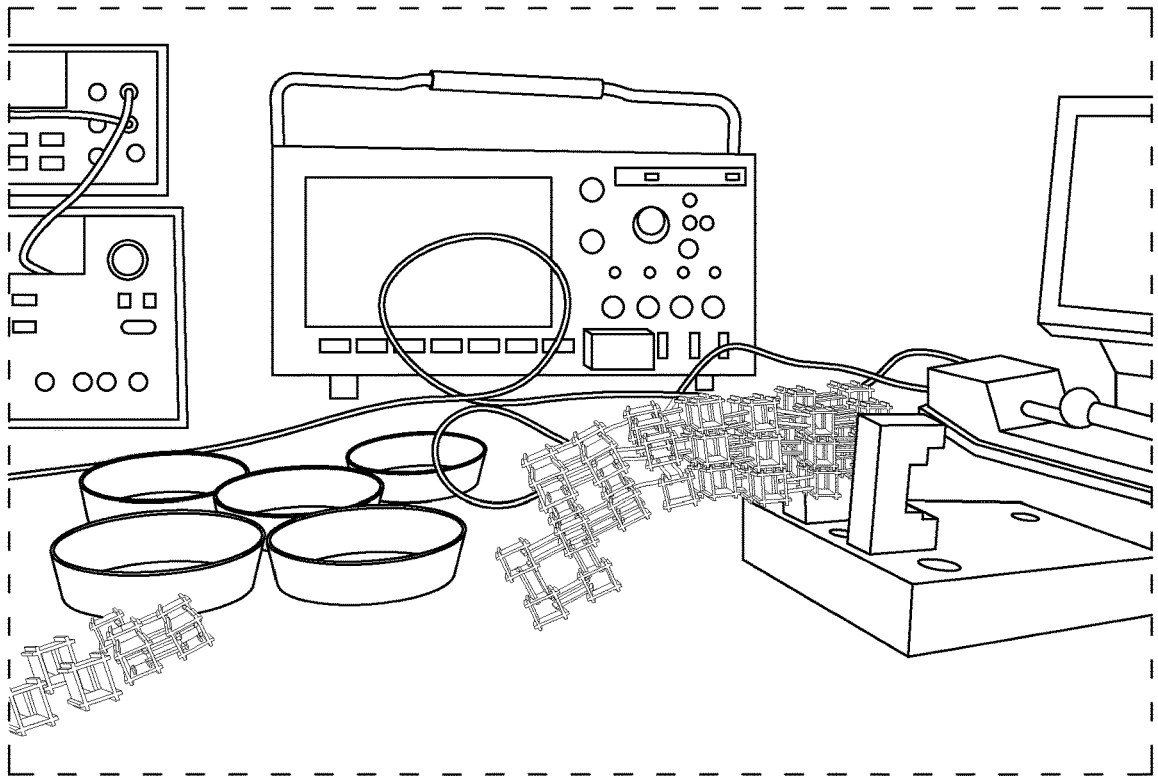
FIG. 7 and FIG. 8 show actual laboratory structures constructed.
Figure 8:
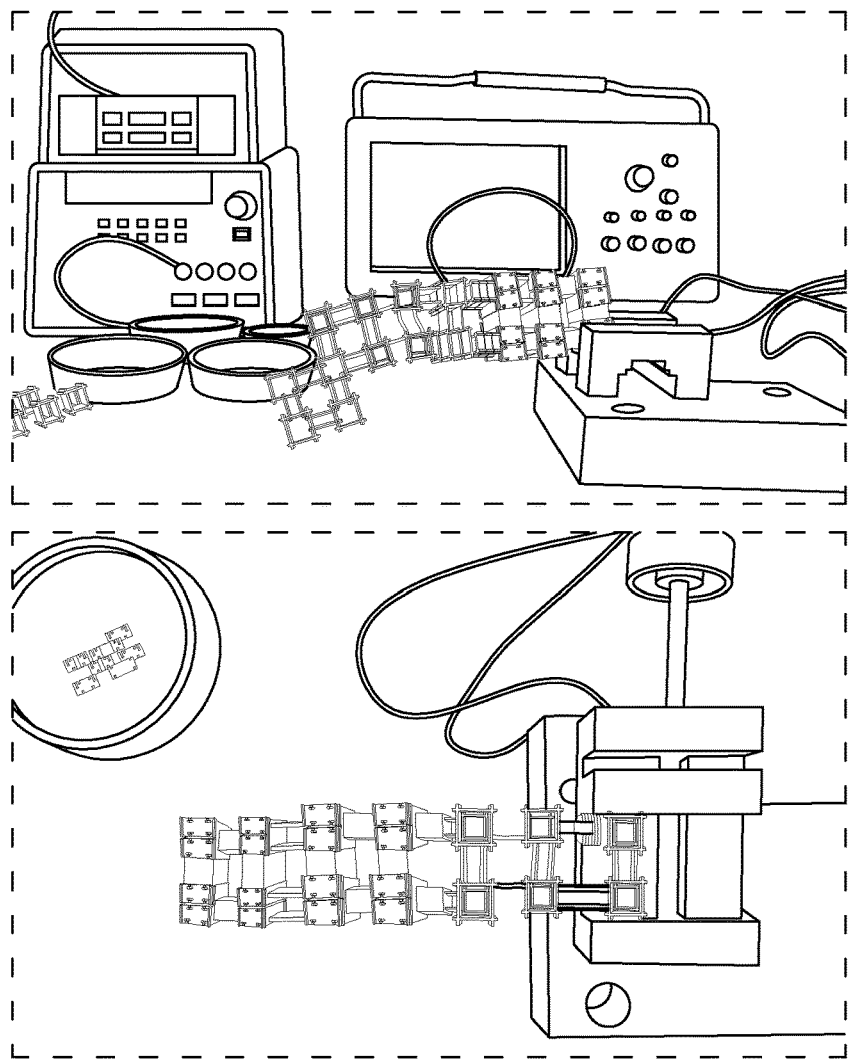

There are two fundamental types of building blocks in this assembly architecture: node parts and strut parts. The building blocks are arranged hierarchically. Fabricated two-dimensional parts (node parts and strut parts) are first assembled into struts and nodes. Each node is assembled from four identical parts, each with four slots, which are used to rigidly connect to struts. The struts house most of the functionality of this building system and so can be built in a few different ways depending on their intended purpose. FIG. 5 shows an example of struts and nodes and of an assembly of both. FIG. 6 shows another example of a structure, while FIGS. 7 and 8 show actual laboratory structures constructed. These structures are built in planes and can be linked to assemble quasi-isotropic structures using struts and change orientation and vertical spaces that offset every two nodes.

Figure 9:
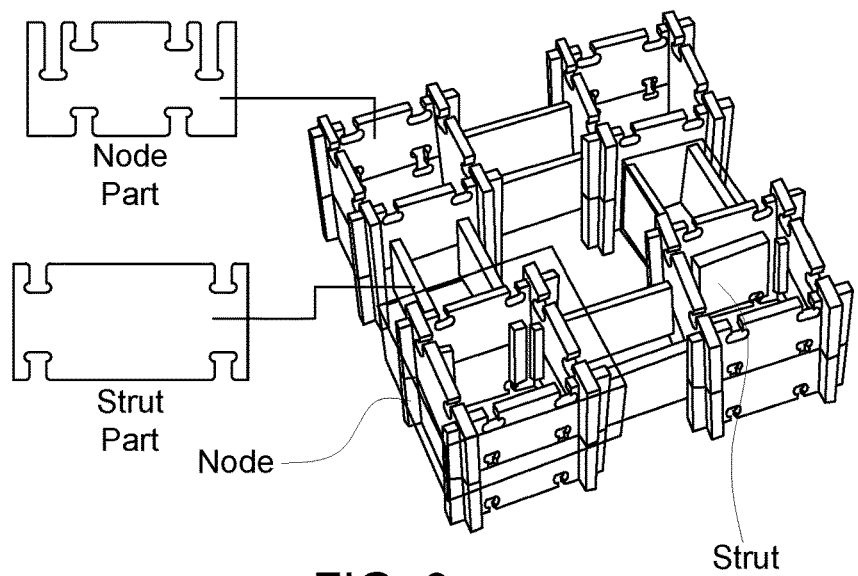
FIG. 9 shows how a regular rigid structure can be fulfilled using struts composed of two identical two-dimensional parts.

Regular rigid structure can be fulfilled using struts composed of two identical two-dimensional parts. Flexural struts can be assembled either from a combination of two-dimensional laminate parts, or from folded laminate parts. Furthermore, actuated struts can be assembled from two special part-types: one made of high permeability material such as iron or steel which houses two magnets and forms an E-core, and the other which serves as a mandrel on which a coil is wound. This is shown in FIG. 9.

Scaling

Figure 10:
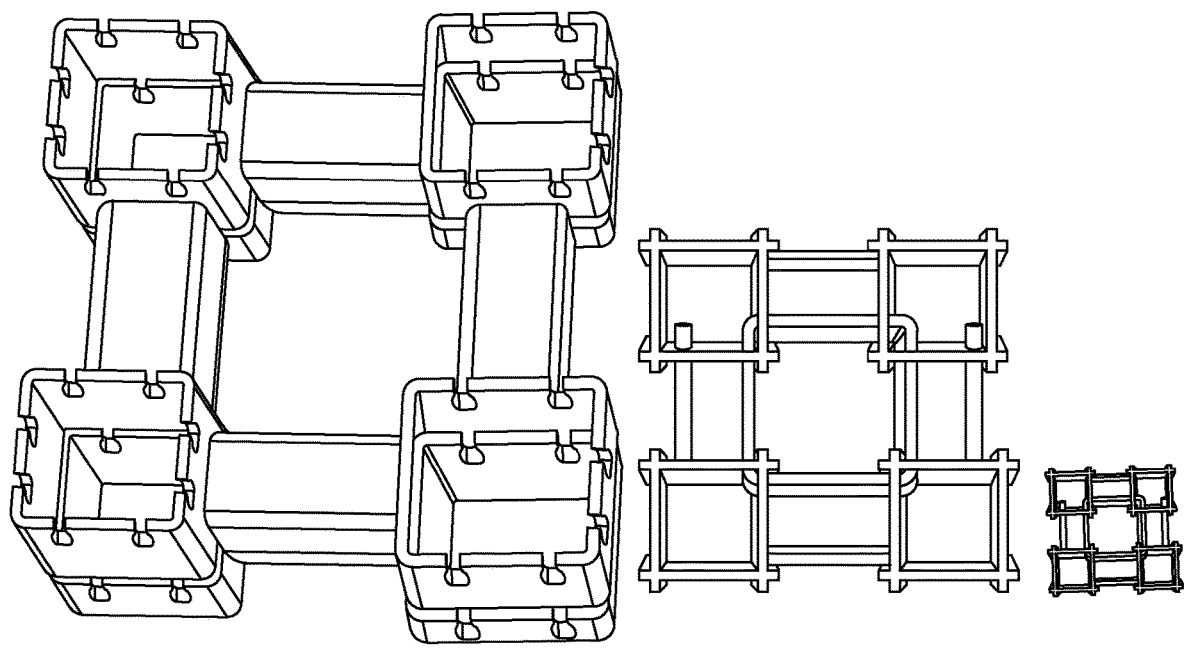
FIGS. 10-12 depict different length scales showing the possibility of 3D-printing, laser-cutting, and Wire-EDM'ing the parts.
Figure 11:
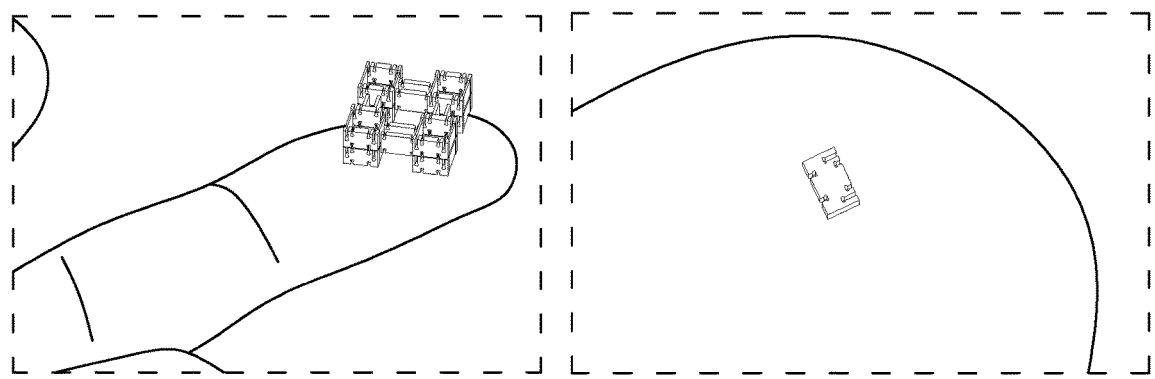
Figure 12:
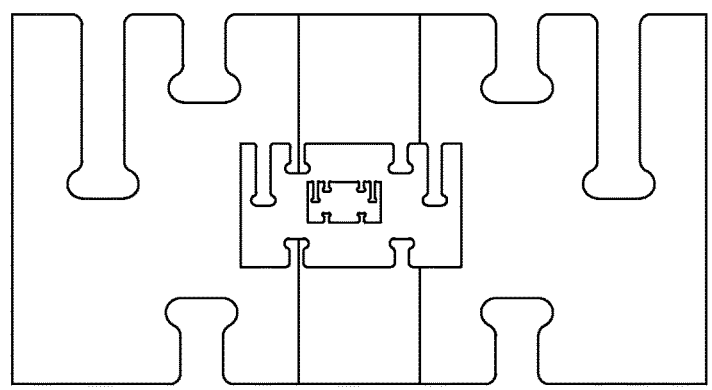

The flexibility of this building system enables fabrication at a variety of length-scales using a variety of processes. Shown in FIGS. 10-12 are a few different length scales showing the possibility of 3D-printing, laser-cutting, and Wire-EDM. For perspective, three scales of the node part spanning an order of magnitude from largest to smallest are shown. Initially there has been prototyping with centimeter scale parts, eventually, the assembly of millimeter, and sub-millimeter, parts will be targeted. The millimeter parts are made using the Wire-EDM with the 0.004" wire, which cuts with about a 0.007" kerf. Below this scale, parts can be made using the Oxford micromachining Laser which has a kerf of about 20 um. These parts are 75 um thick and are 1 mm long in their longest dimension.

Figure 13:
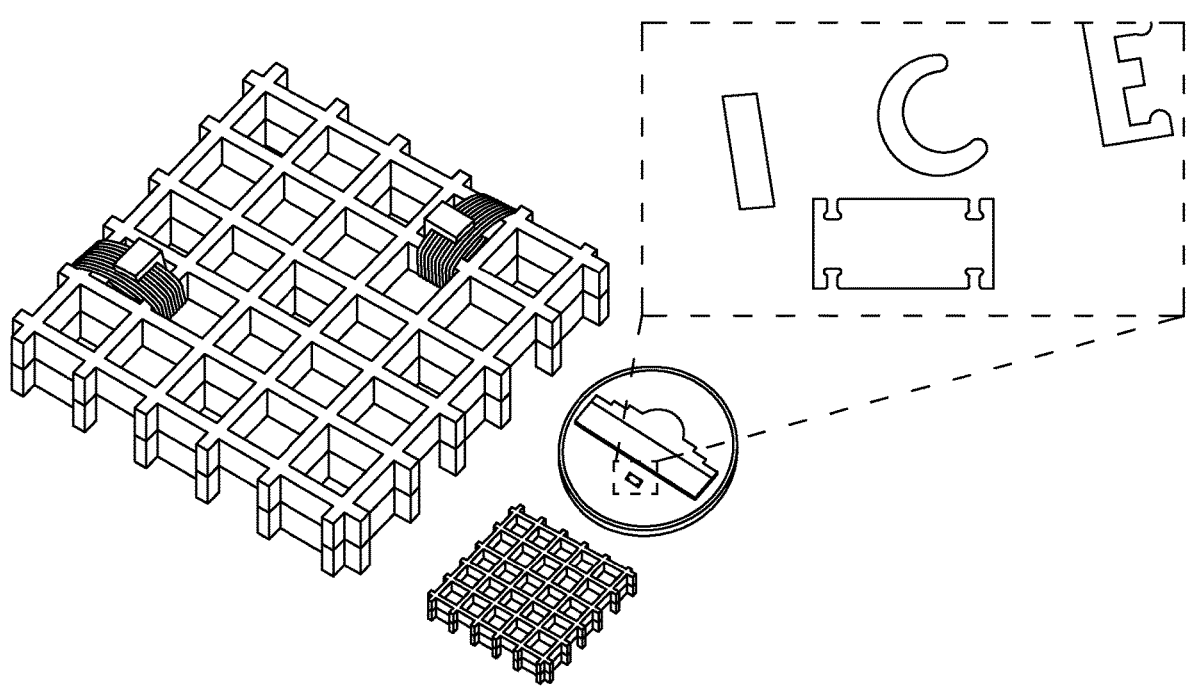
FIG. 13 is a walking motor shown in three different scales.

Pictured in FIG. 13 is a walking motor (discussed later in Actuation), assembled at the centimeter scale. A millimeter scale model is shown next to it assembled from rigid parts. Finally, a microscale part ('~' 1 mm in longest dimension) is pictured on a nickel for scale.

Mechanism

Fabrication

Figure 14:
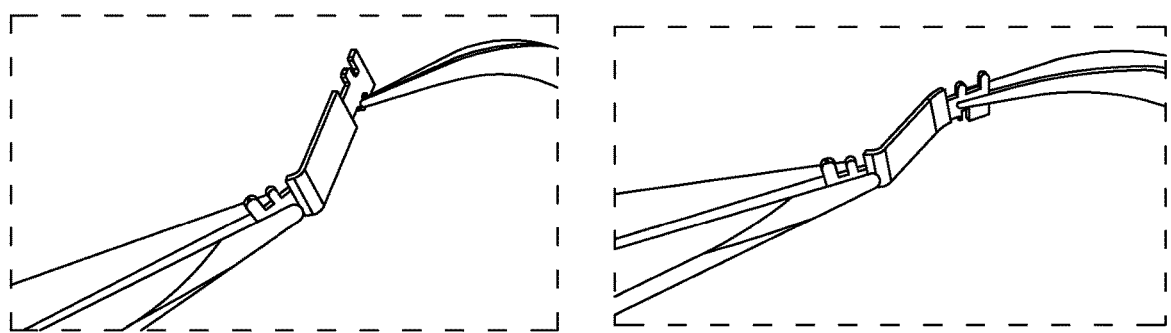
FIG. 14 shows a single degree-of-freedom part (left) and a two degree-of-freedom part (right).

Mechanisms can be assembled by using parts with embedded flexural joints. Four part-types are useful for assembling a wide variety of mechanisms; these include rigid parts, and flexible parts with one, two, and three degrees-of-freedom. Shown in FIG. 14 are a single degree-of-freedom part (left) and a two degree-of-freedom part (right). The flexible hinges in these parts are close mirrors to conventional hinges at the macro scale. These parts can be efficiently manufactured using a laminate construction technique. Individual layers are laser machined and subsequently bonded together using a flexible double-sided tape.

In order for these parts to rigidly connect with other parts in this construction system, the thickness of the laminate needs to match the standard part-thickness. A series of experiments were performed to determine a tape/material combination with adequate thickness, ultimately settling on using 0.0125" delrin with '~6mil 3M 410M double-sided tape. This is shown in FIG. 15.

Figure 17:
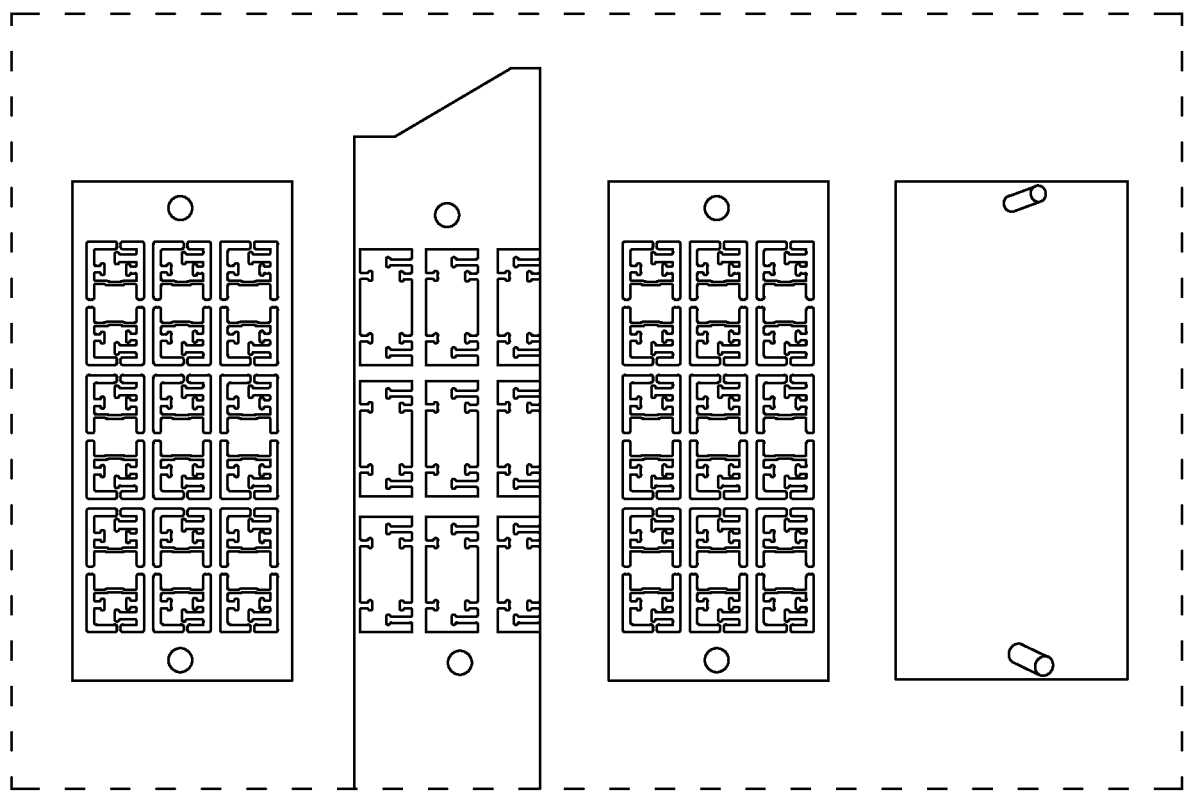
FIG. 17 shows a simple jig that can be used to align the individually machined layers and press them together using an acrylic roller.
Figure 18:
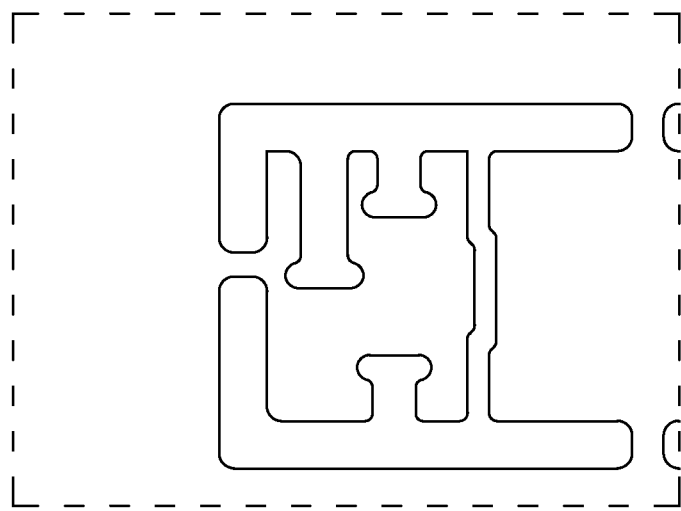
FIG. 18 shows that the alignment between layers does not have to be not perfect.
Figure 19:
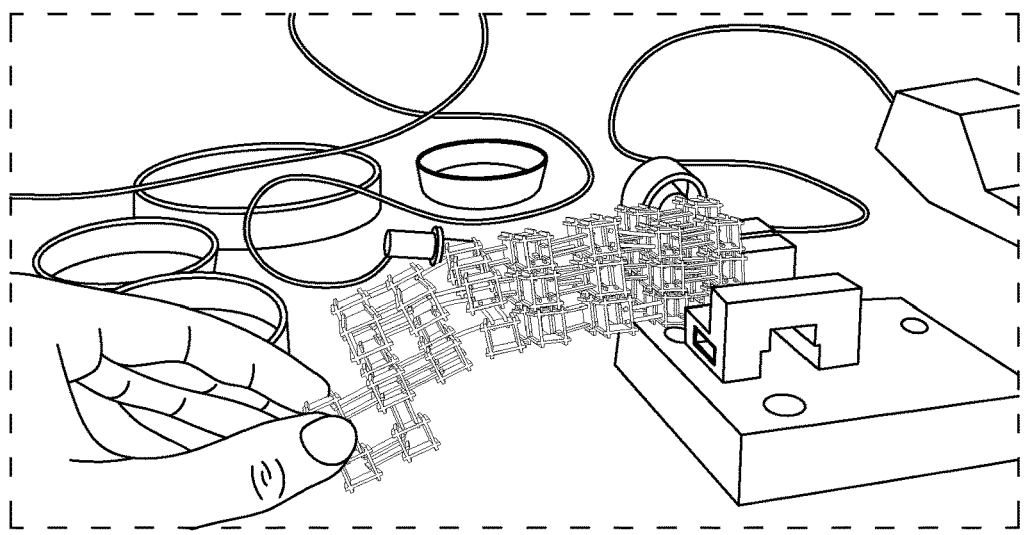
FIGS. 19-22 show that, once fabricated, these parts can be assembled to form a variety linkages and mechanisms.
Figure 20:
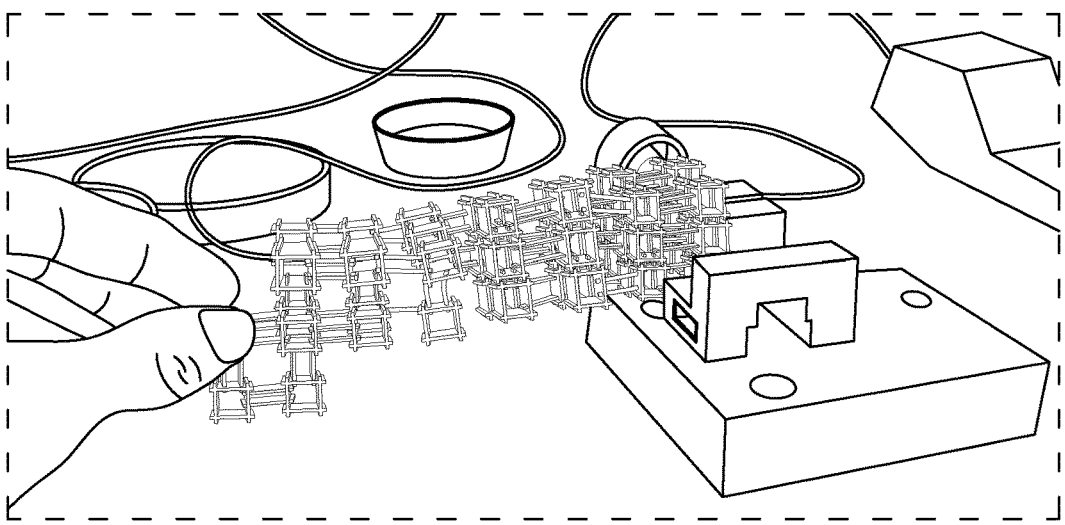
Figure 21:
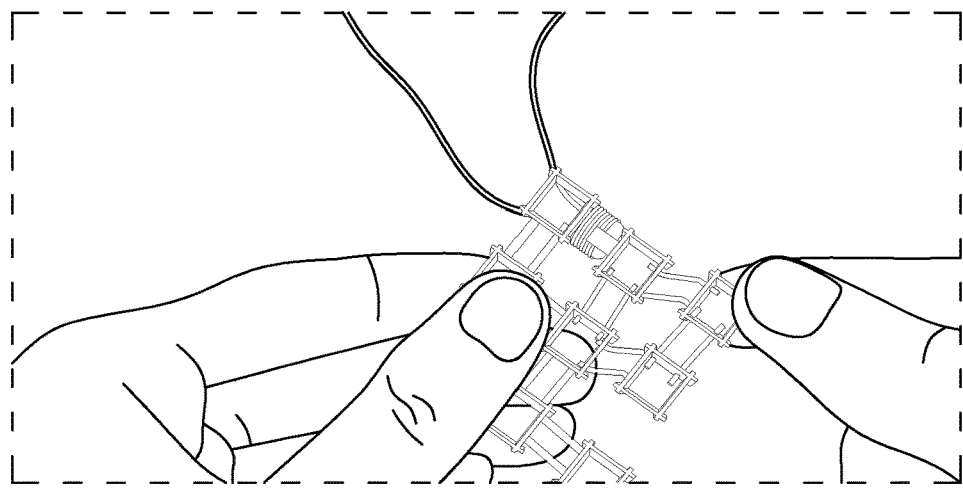
Figure 22:
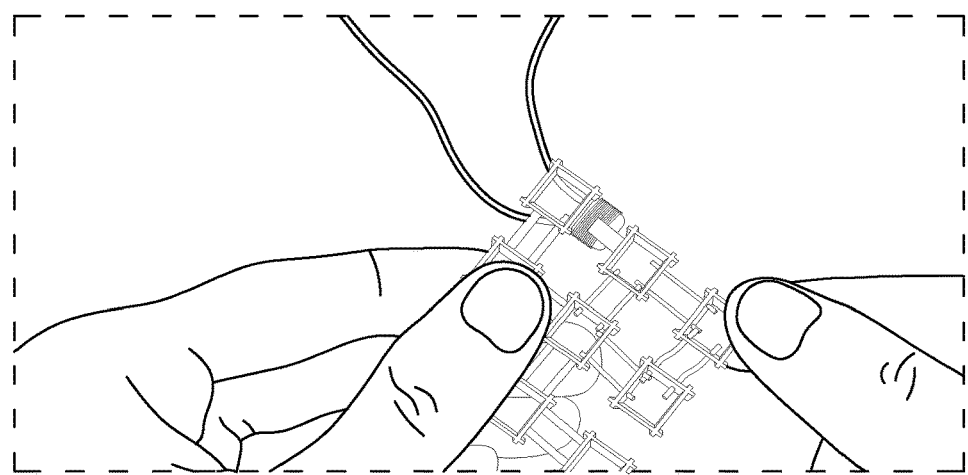

When laser cutting the individual layers, tabs are used to keep parts attached to a scaffold structure. Unfortunately this results in many little parts that need to be picked off with tweezers as shown in FIG. 16. The double-sided tape is also machined on the laser. With careful control of the laser speed and power, it's possible to cut through just the tape but not through the backing. A simple jig shown in FIG. 17 can be used to align the individually machined layers and press it together using an acrylic roller. The alignment between layers does not have to be not perfect, but rather sufficient to make a solid connection with neighboring parts as shown in FIG. 18.

Parts with embedded hinges are fabricated using a laminate process. Layers are individually machined and then laminated together to form a composite. Flexural hinges are created by an absence of rigid material on either side of a more flexible core. The layers used to make the flexible part types are shown below.

Assembly

Figure 23:
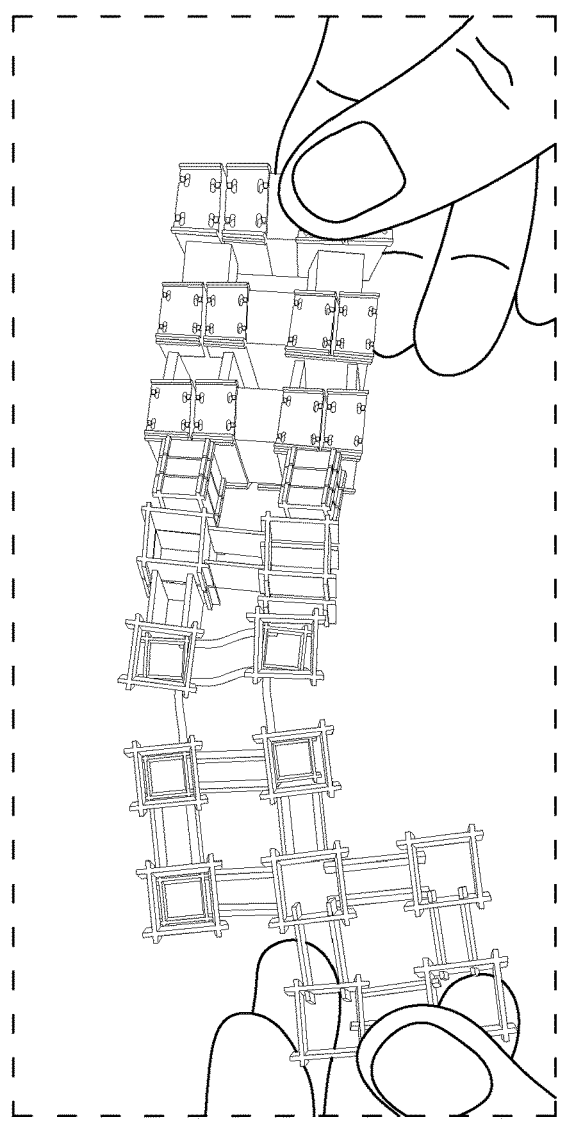
FIG. 23 shows a "leg" with two orthogonal revolute degrees of freedom.

Once fabricated, these parts can be assembled to form a variety linkages and mechanisms as shown in FIGS. 19-22. A revolute joint can be made, for example, using two single degree-of-freedom struts along with two 2-degree-of-freedom struts, which are used to constrain the motion of an actuator. FIG. 23 shows a "leg" with two orthogonal revolute degrees of freedom.

Actuation

Design

Figure 24:
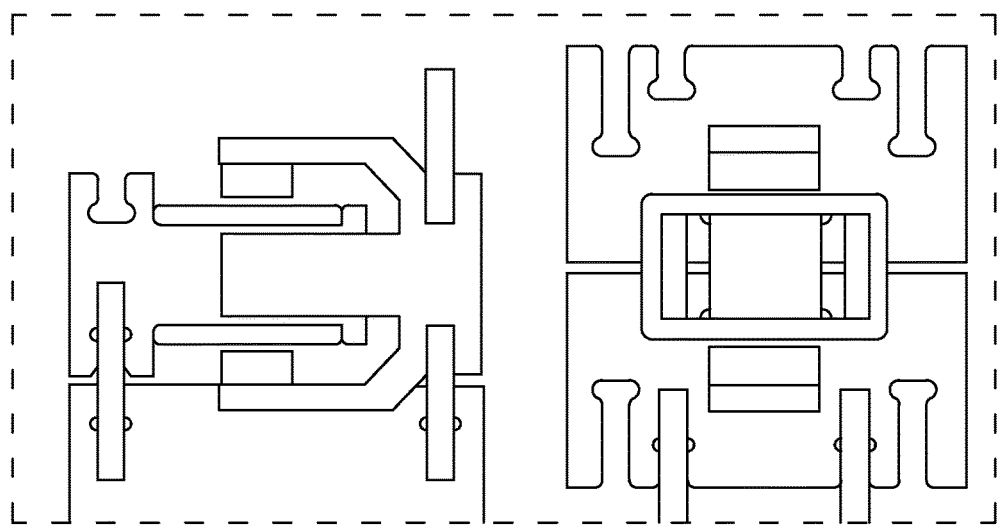
FIG. 24 shows a design example of an actuator.

FIG. 24 shows a design example of an actuator.

Simulation

Figure 25:
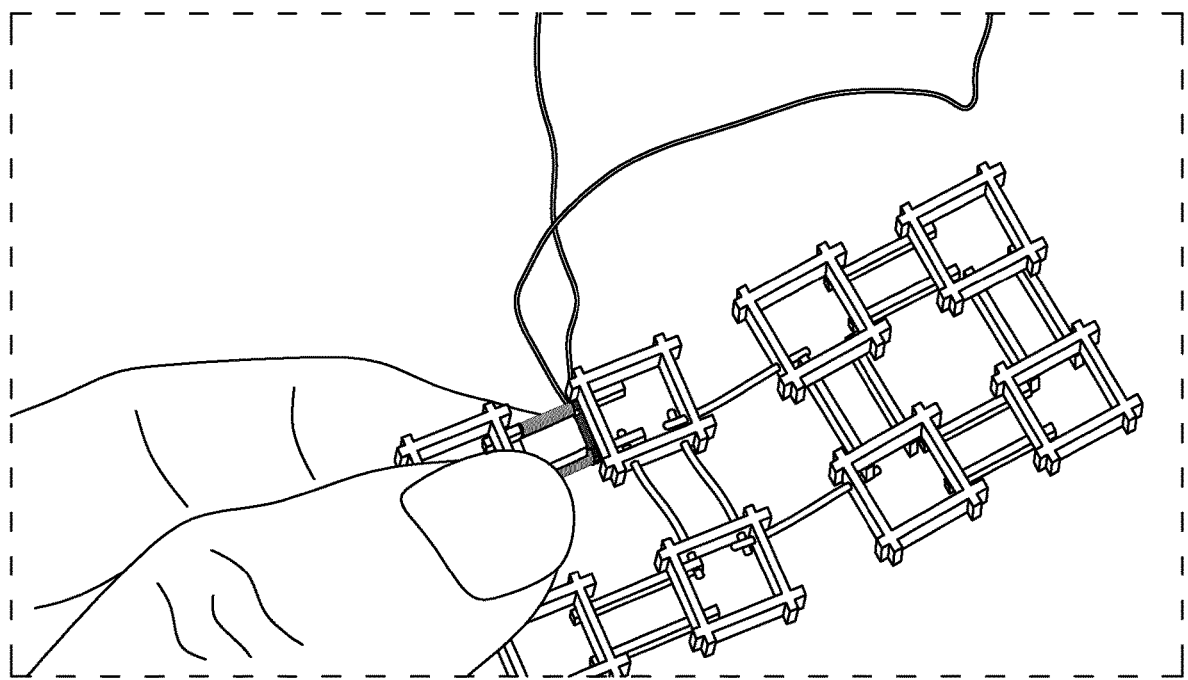
FIGS. 25-26 show such a voice coil actuator.
Figure 26:
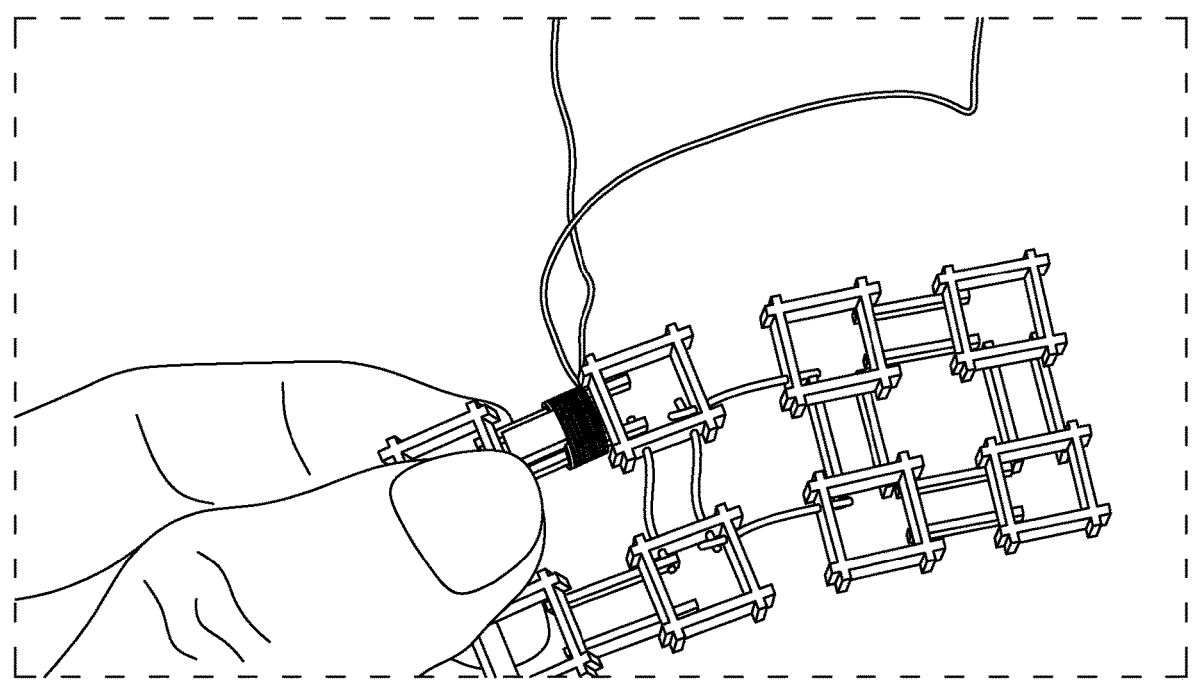

Voice coil actuators can be roughly modeled using magnetic circuit theory to calculate the magnetic field across the coil and calculate the resulting Lorentz force. From this it is determined that the initial design is expected to produce about 200 mN of force with 1 A of current. This assumes magnets that are 3 mm×2 mm×1 mm, a coil that is 1 mm thick, and with 0.25 mm of air-gap left on either side of the coil. FIGS. 25-26 show such a voice coil actuator. By increasing the magnet size to 6 mm×3 mm×2 mm, and the coil-thickness to 2 mm, the expected force can be increased to approximately 1N. This requires slightly more complicated geometry to achieve but may be do-able without introducing too many custom or difficult-to machine parts.

Testing

Figure 27:
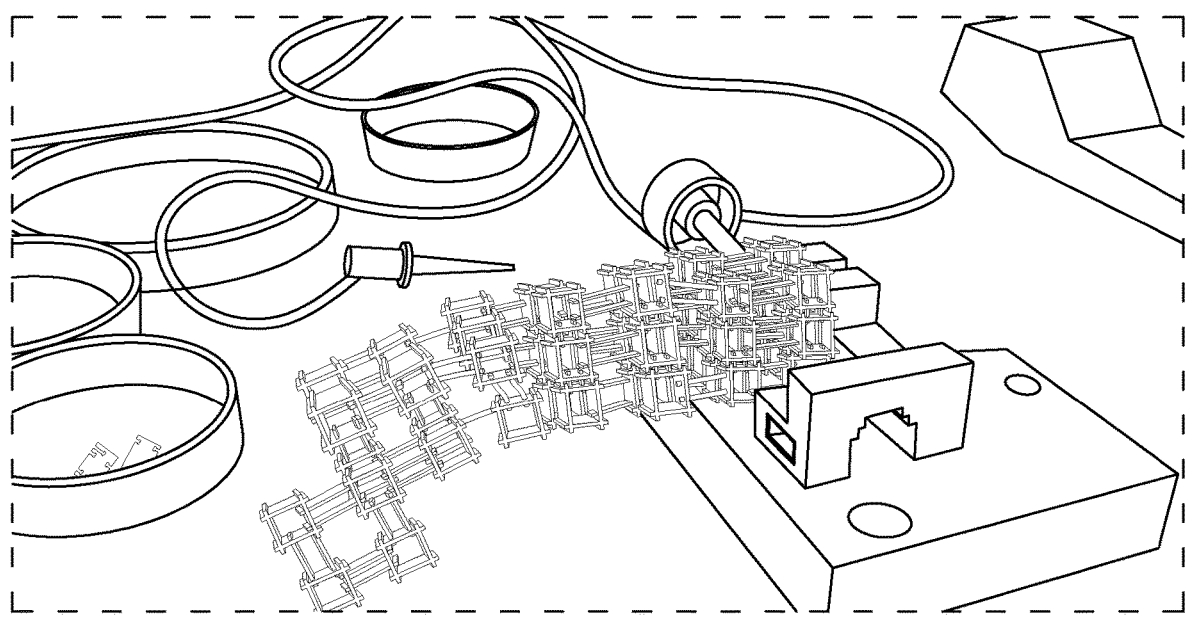
FIGS. 27-29 show actuators are tested qualitatively by building them into mechanisms and powering them using an H-Bridge to switch current through the coils bi-directionally.
Figure 28:
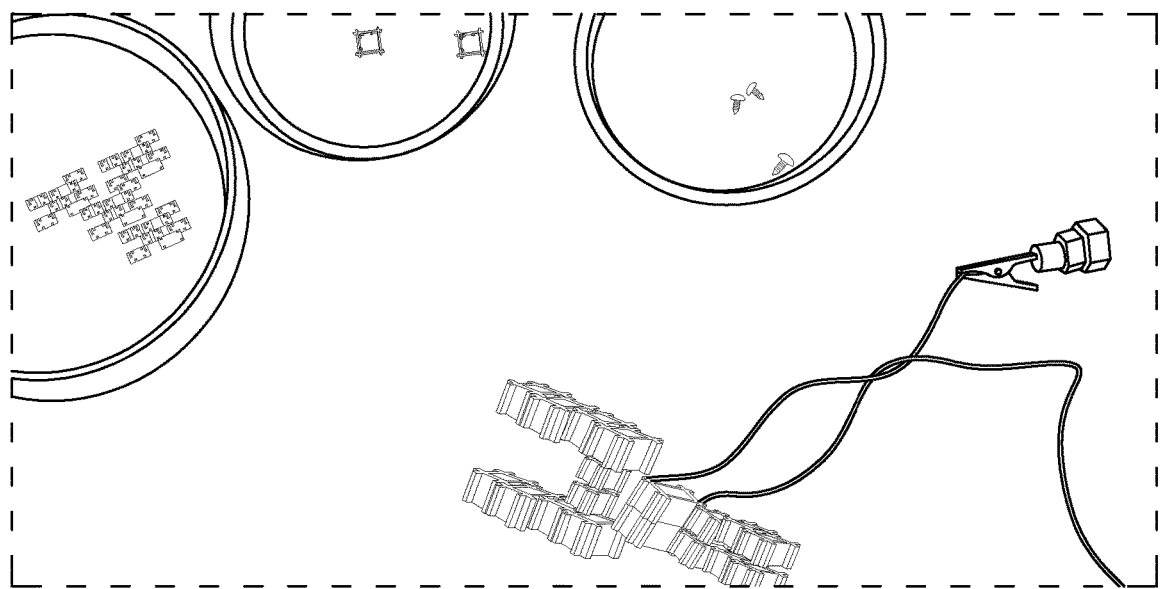
Figure 29:
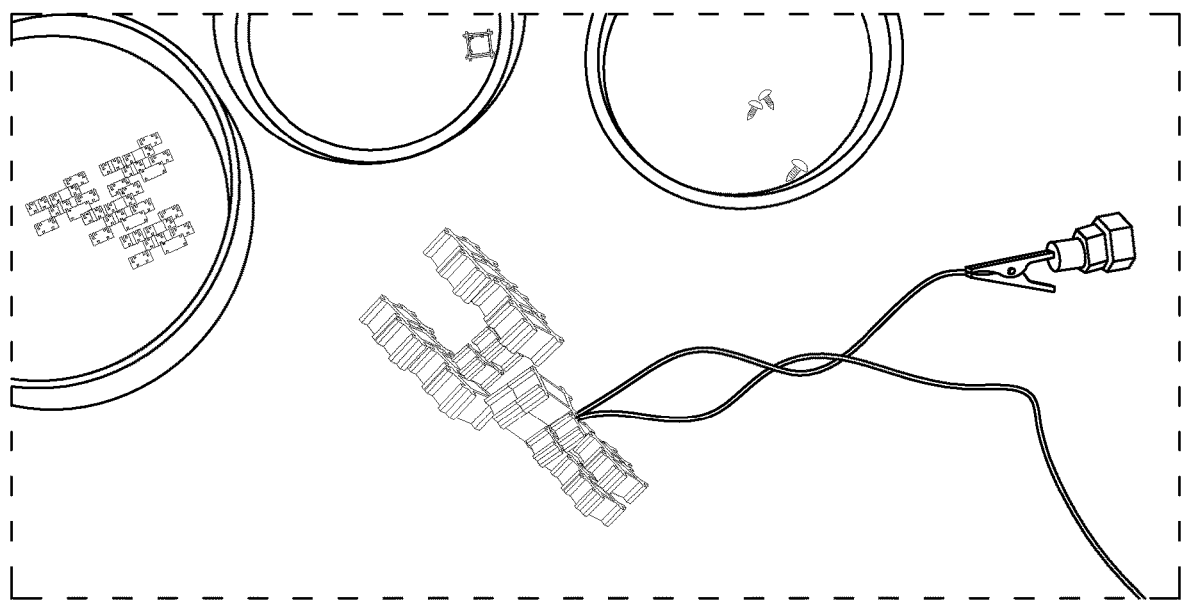

The actuators are tested qualitatively by building them into mechanisms and powering them using an H-Bridge to switch current through the coils bi-directionally. This is shown in FIGS. 27-29. The force produced by the actuators is measured using a table-top instron.

Initial testing indicates that the actuator is only producing approximately 50 mN of force with 1 A of current (supplied directly from a current-limited power supply). This is corroborated by the fact that it can lift a 5 g bolt but fails to lift a 10 g mass under these conditions. While testing the coil at 1.5 A, the coil was becoming hot enough to melt the delrin mandrel parts (but not before destroying the parts). It took less than 30 seconds to reach that temperature (which means that 1.5 A is a firm upper-limit unless it is used with very short duty-cycles).

Voice Coils

Figure 30:
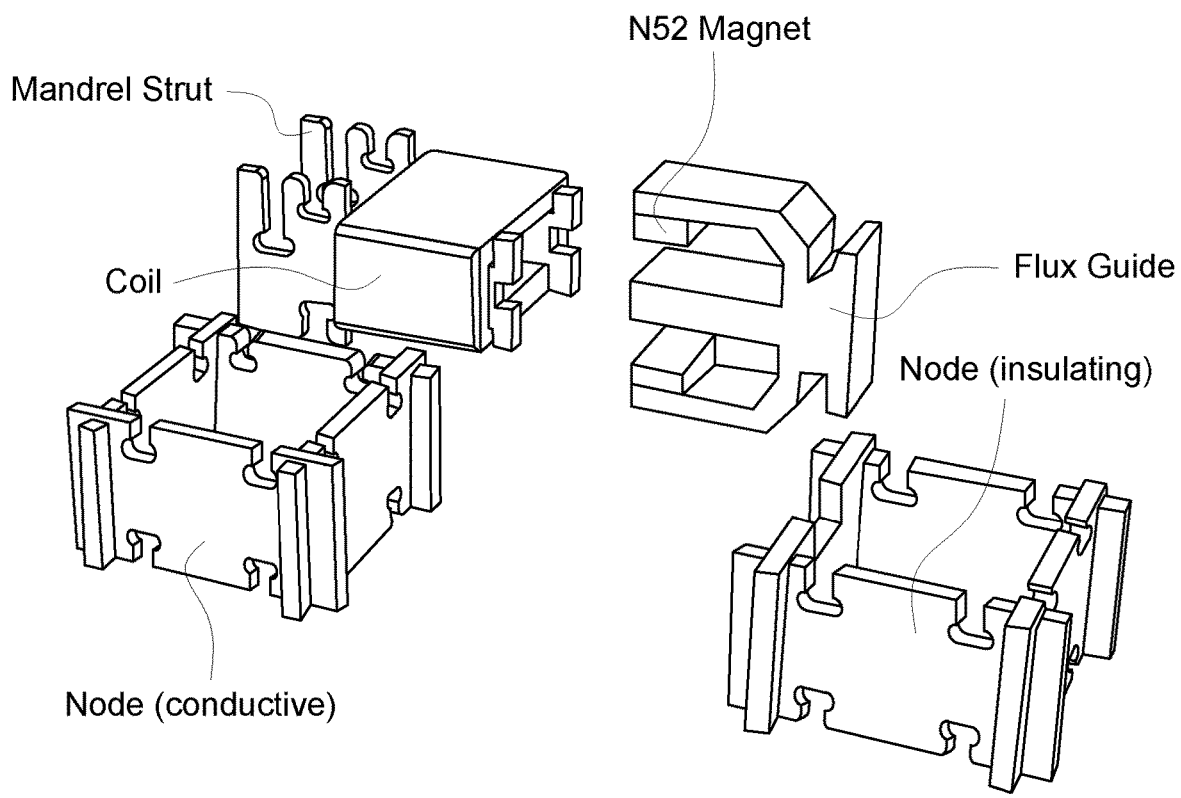
FIG. 30 shows such a voice coil actuator.

Actuation in the structure is provided by individual voice coil actuators, which, like the rest of the structure, are assembled from a small set of parts. The actuators are composed of two main parts: a coil part and a magnet part. The coil part is itself composed of two struts, which form a mandrel around which, a coil is wound. The magnet part is composed of a permeable flux guide (made of steel or iron) in which two magnets are arranged such that their poles face each other. This produces a relatively large magnetic flux density between each of the magnets and the center core of the flux guide. The top and bottom of the coil fit in this gap with high magnetic flux and are free to slide in and out. When current is passed through the coil, it creates its own magnetic field which opposes that of the permanent magnets and effectively pulls or pushes the coil part relative to the magnet part. FIG. 30 shows such a voice coil actuator.

Figure 31:
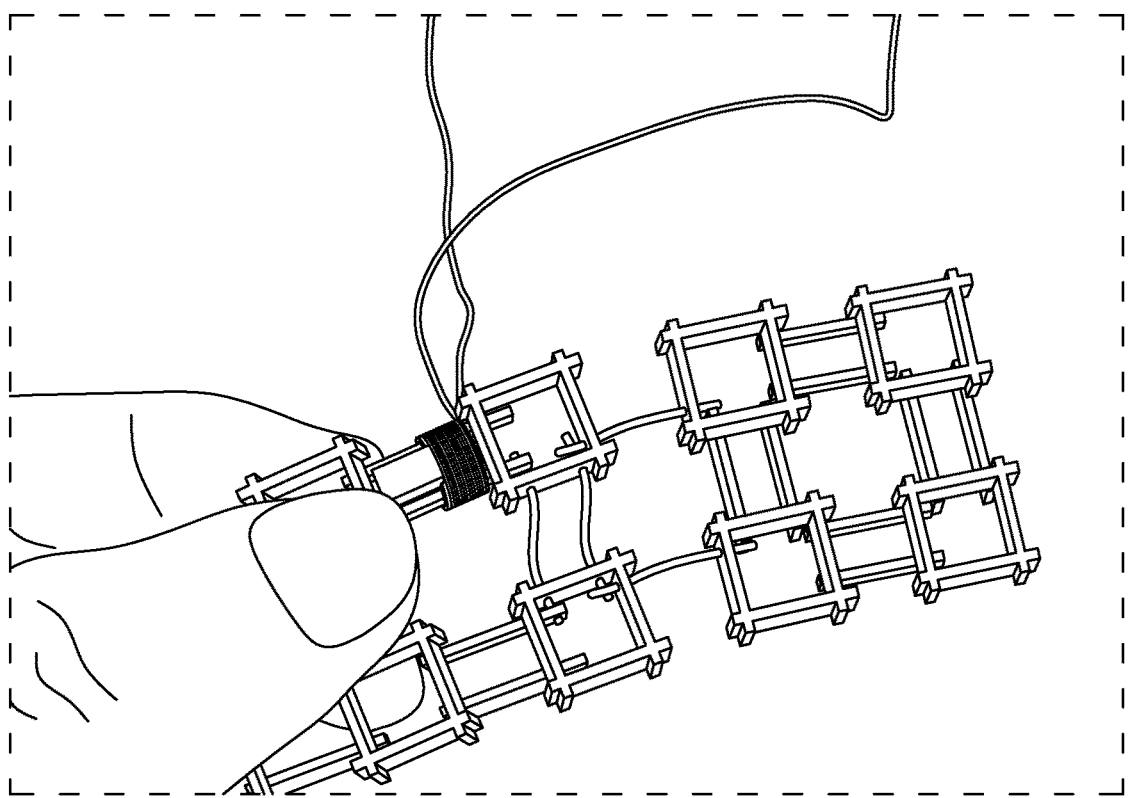
FIG. 31 shows a revolute joint that uses two 2-DoF flexural struts arranged in parallel to form a linkage which approximates straight-line motion.
Figure 32:
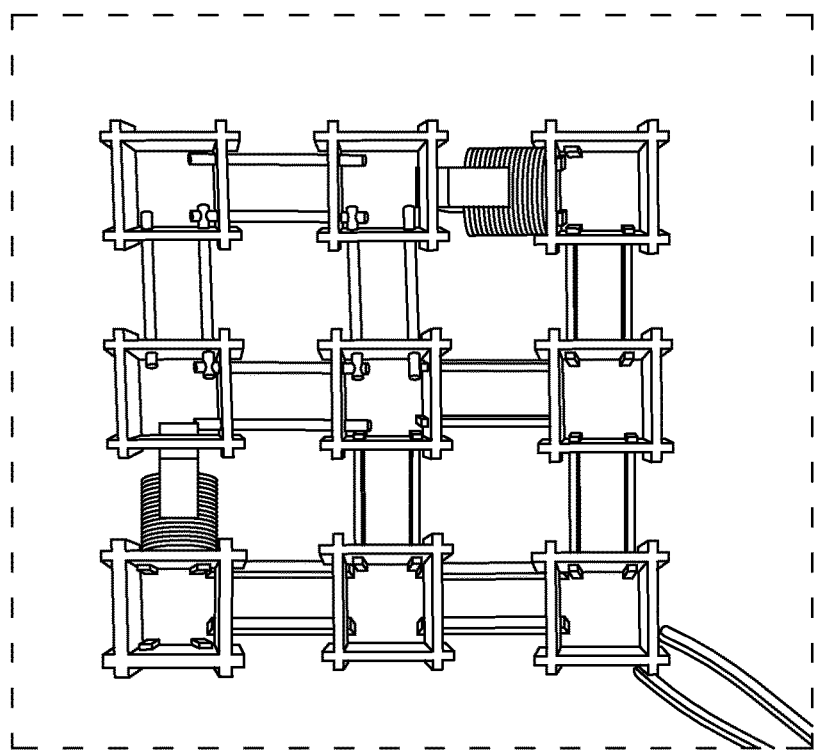
FIG. 32 shows an embodiment of a walking motor.
Figure 33:
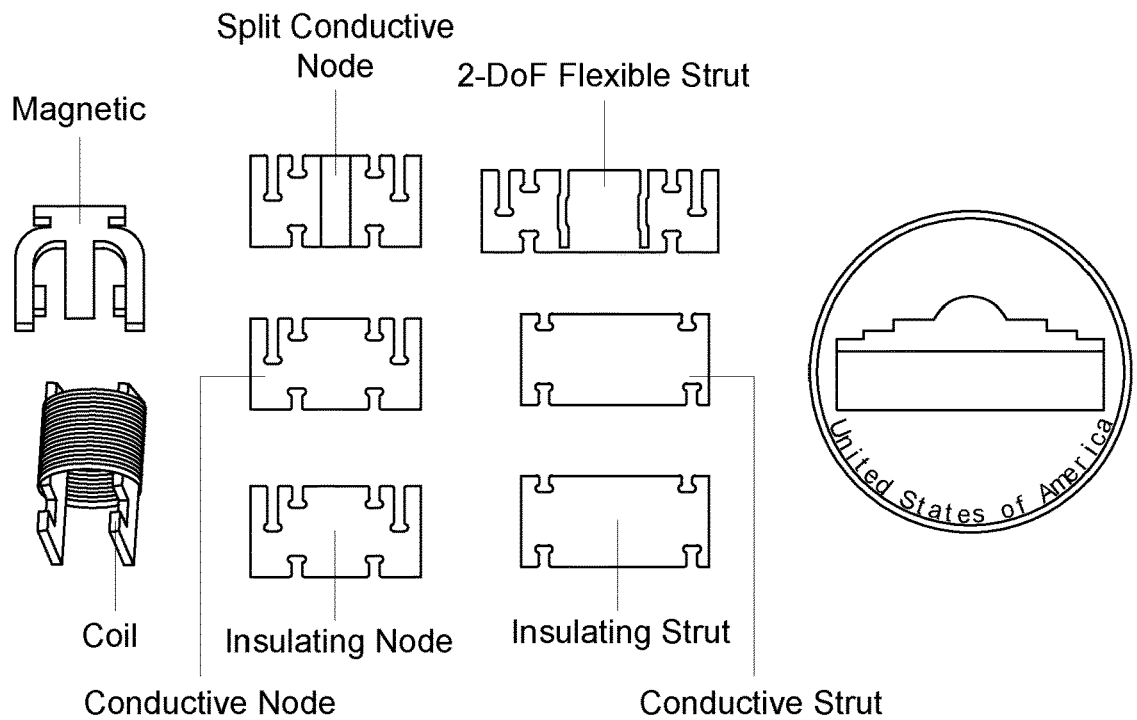
FIG. 33 shows the small set of parts needed to assemble a walking motor.

The actuator needs to have its motion properly constrained in order to function. This can be accomplished in a variety of ways. FIG. 31 shows a revolute joint that uses two 2-DoF flexural struts arranged in parallel to form a linkage that approximates straight-line motion. This effectively constrains the actuator to move along that linear dimension. The actuator then transmits its force through a pair of 1 DoE flexural struts to convert its linear motion into revolute motion of part of the structure Walking Motors FIG. 32 shows an embodiment of a walking motor. In order to enable locomotion beyond the limited stroke of an individual actuator, a walking motor can be assembled which produces long-range motion through small repeated steps. This device is assembled from a small-set of standardized parts as shown in FIG. 33. This includes three node part-types (conducting, insulating, and split-conductive), three strut part-types (conducting, insulating, and 2-DoE flexural), and two actuator part-types (coil and magnetic).

Figure 34:
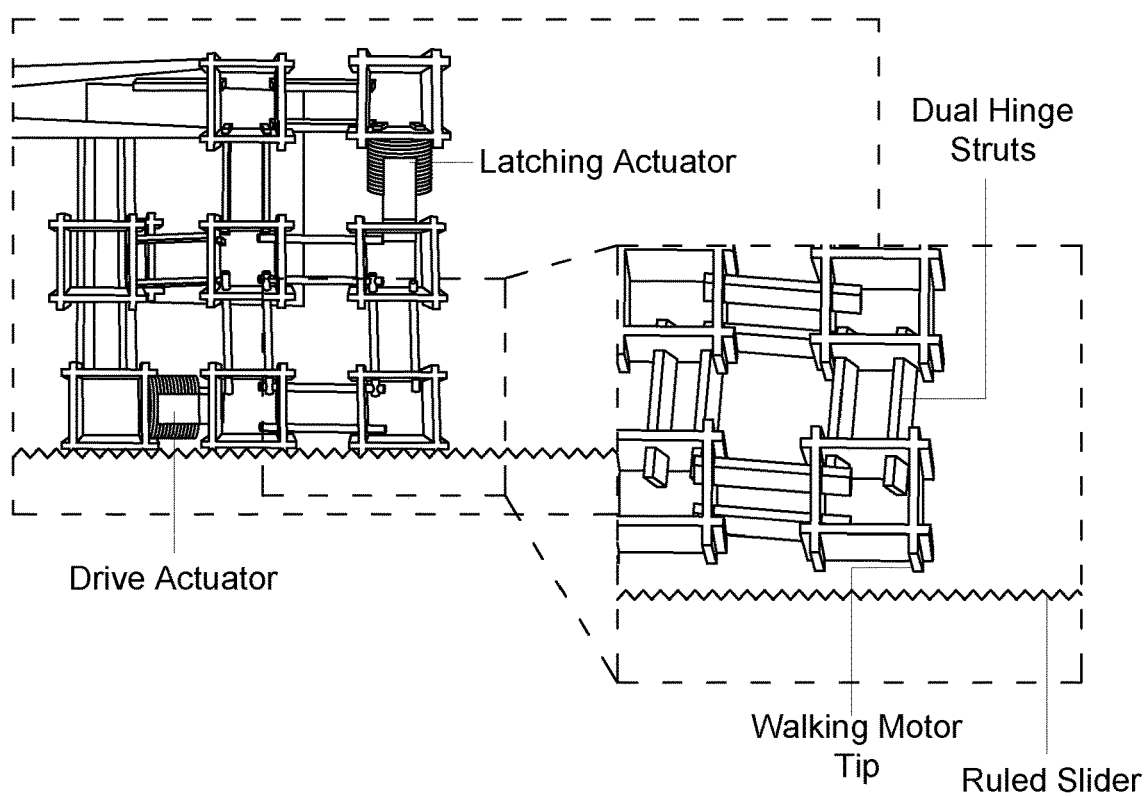
FIG. 34 shows a walking motor powered by two orthogonally oriented voice coil actuators.

The walking motor is powered by two orthogonally oriented voice coil actuators as shown in FIG. 34. The stroke of one actuator, the "drive" actuator, is arranged to be parallel to the direction of long-range travel. The other actuator, or "latching" actuator, is used to engage and disengage the motor tip with a ruled slider. These actuations are transferred to the motor "tip" through a number of double-hinge struts that are arranged to enable independent vertical and horizontal shearing motions. For initial testing a ruled slider also shown in FIG. 34 is used to demonstrate how a series of small steps can create long-range motion. The slider has 1 mm wide notches with a pitch between notches of 2 mm.

Figure 35:
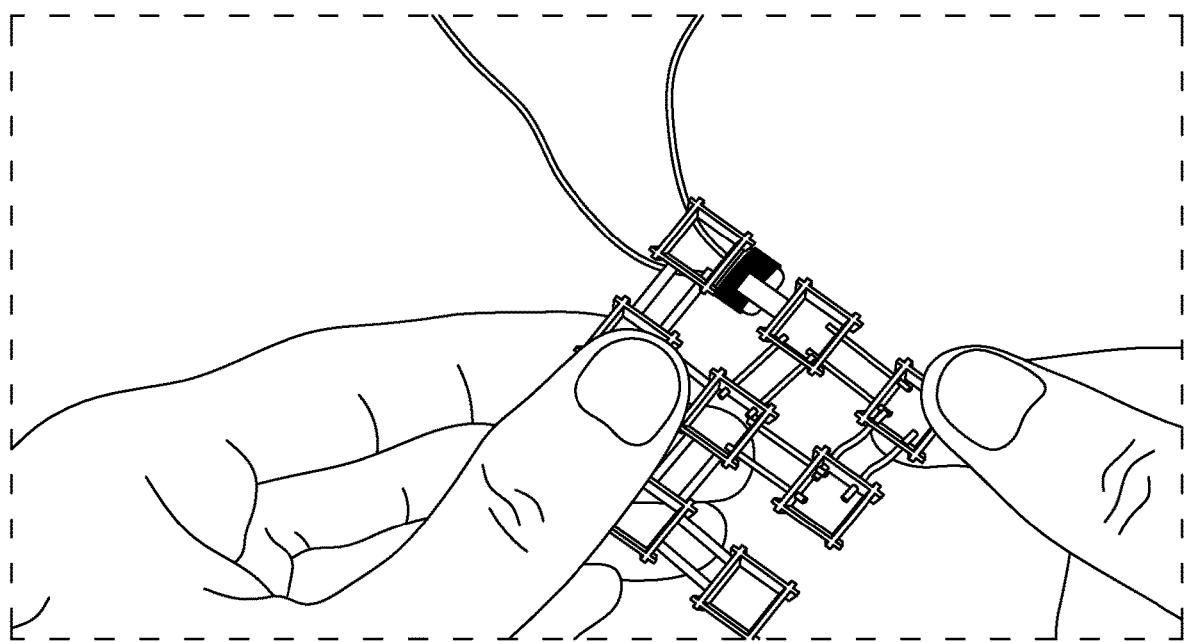
FIGS. 35-37 show the development and prototyping of this motor evolving from a manually driven test of the mechanism, to an actuated test, and finally showing its integration ruled slider to enable long-range motion.
Figure 36:
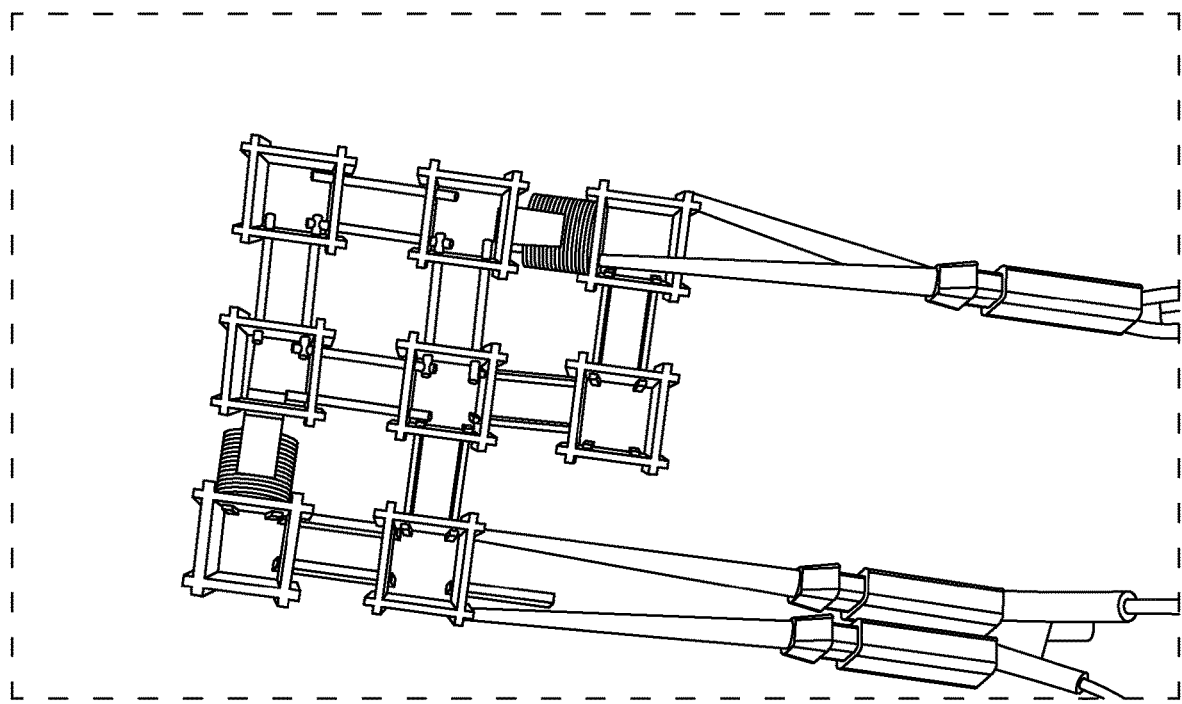
Figure 37:
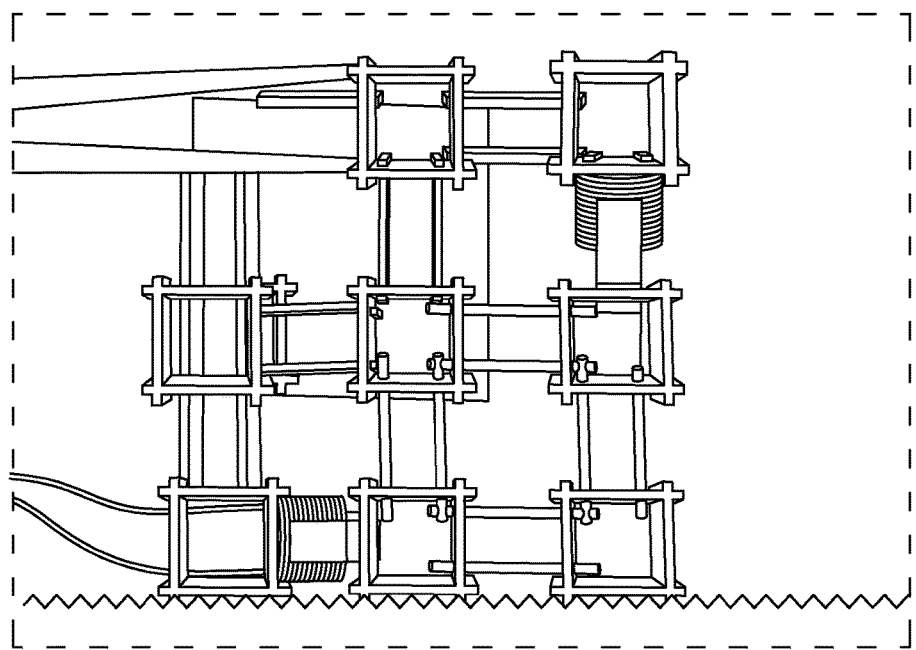

FIGS. 35-37 show the development and prototyping of this motor evolving from a manually driven test of the mechanism, to an actuated test, and finally showing its integration ruled slider to enable long-range motion.

In the experiment, the voice coil actuators are driven with conventional off-board electronics; However, logic and electronics can be integrated within the same assembly architecture, enabling the assembly of the sequencing of the drive signals.

Each voice coil actuator is driven by an H-Bridge motor driver and controlled by an ATmega32u4 microcontroller. In this experiment, the voice coils are driven with sinusoidal waveforms, one phase-shifted by 90 degrees. With a 800 mA main current supply, repeatable motion can be obtained. Beyond 1 A main current supply, the actuators can only be used for a limited time before their temperature rises to potentially damaging levels.

Figure 38:
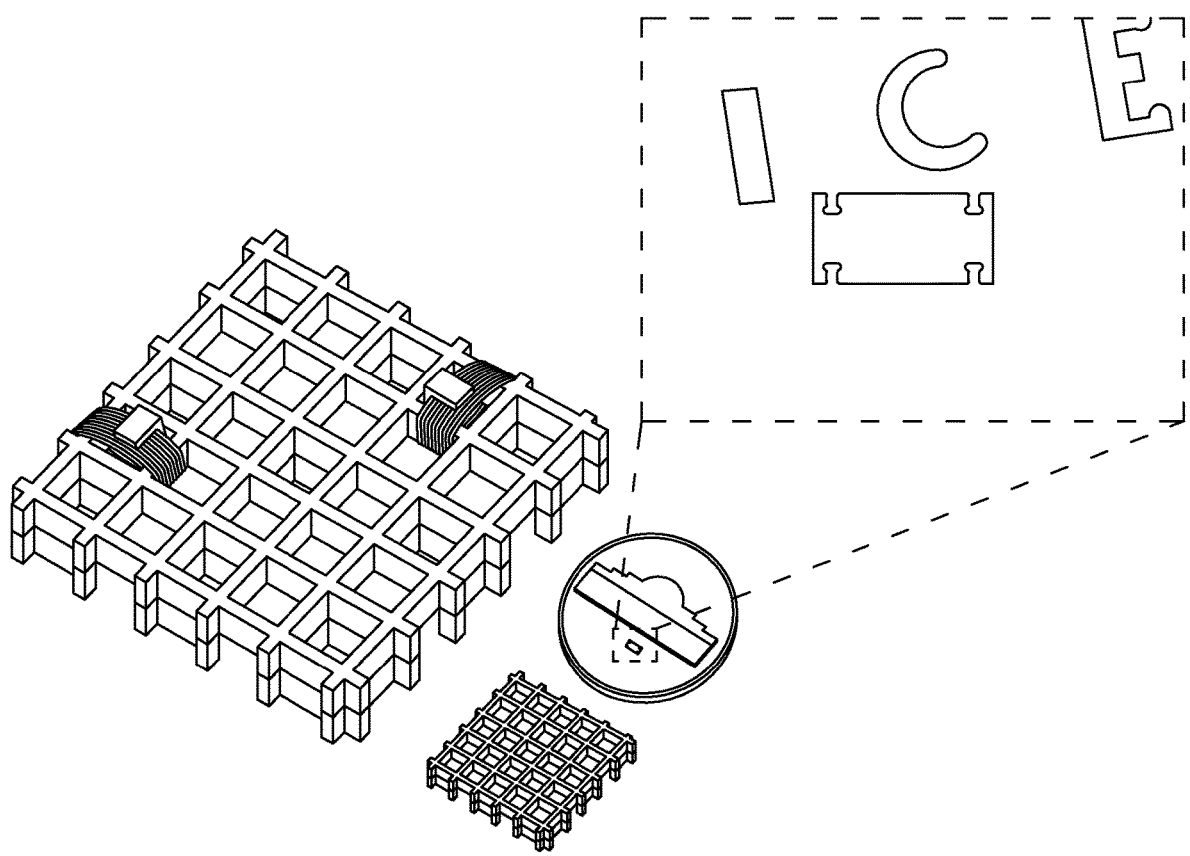
FIG. 38 shows a working prototype of a walking motor next to the same geometry assembled from millimeter scale parts.

The first working prototype was constructed from centimeter-scale parts. Millimeter (and microscale) parts can also be assembled. Pictured in FIG. 38 is a working prototype next to the same geometry assembled from millimeter scale parts.

Circuitry

Figure 39:
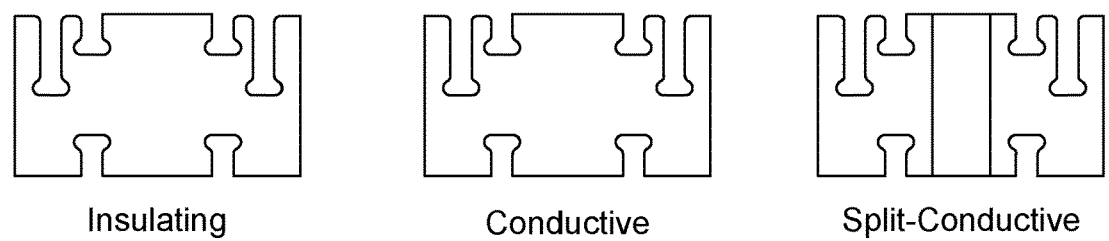
FIG. 39 shows three part types used to fabricate various cells.
Figure 40:
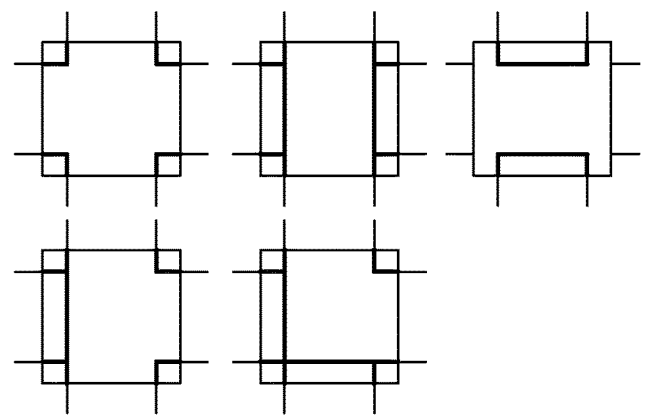
FIG. 40 shows various routing cells.
Figure 41:
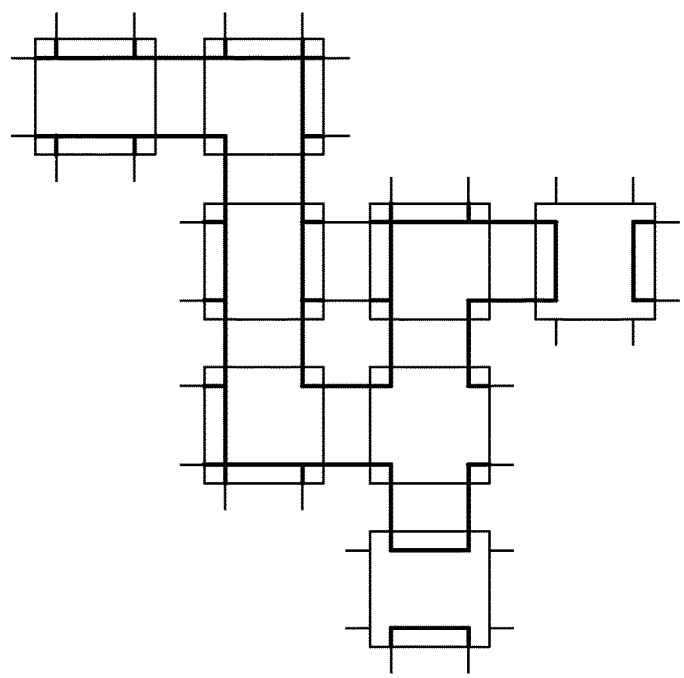
FIG. 41 shows traces routed in 2-D.
Figure 42:
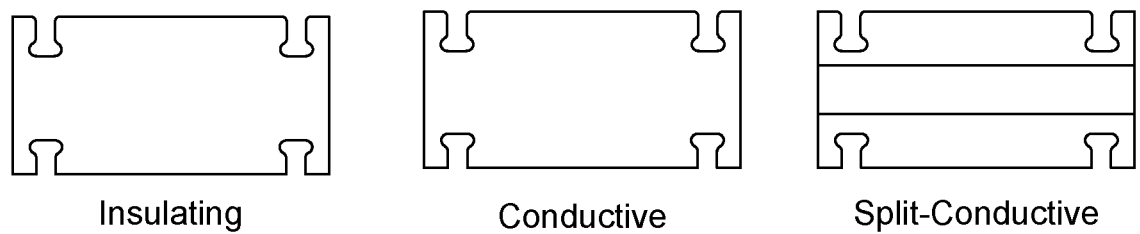
FIG. 42 shows split-conductivity struts.
Figure 43:
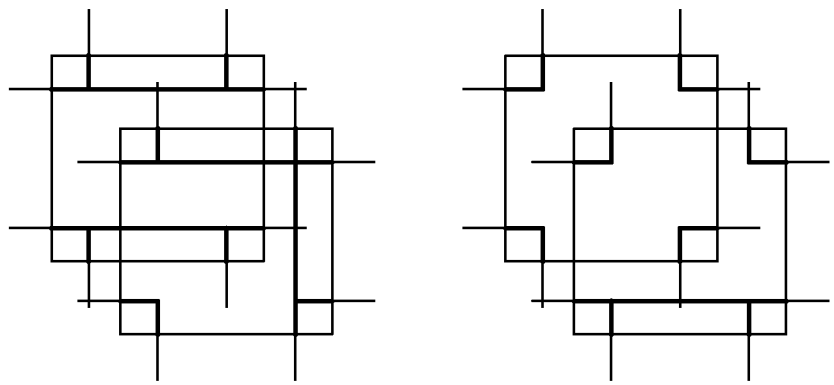
FIG. 43 shows that traces on the upper and lower portion of nodes can be isolated to allow crossover.
Figure 44:
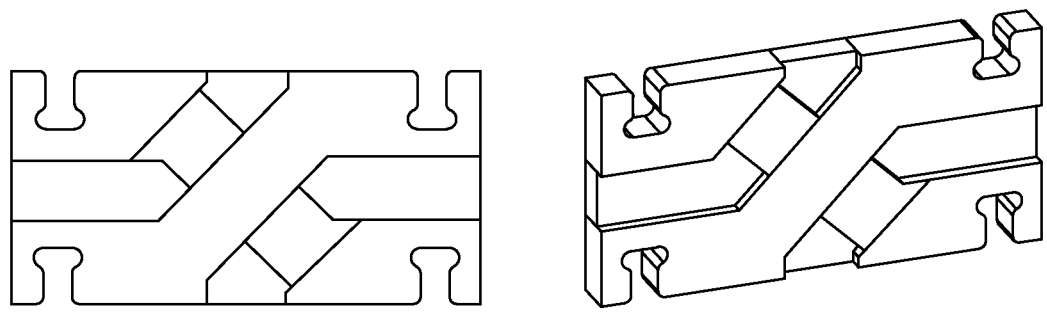
FIG. 44 shows an additional crossover part.

With three part types shown in FIG. 39, various routing cells can be assembled as shown in FIG. 40. Then, through arrangement of the cells, traces can be routed in 2-D as shown in FIG. 41. With the addition of split-conductivity struts shown in FIG. 42, traces on the upper and lower portion of nodes can be isolated and allow crossover within the same node/cell as shown in FIG. 43. An additional crossover part shown in FIG. 44 is necessary to be able to route the bottom of one node to the top of a neighbor node (and vice versa).

Fabrication

Figure 45:
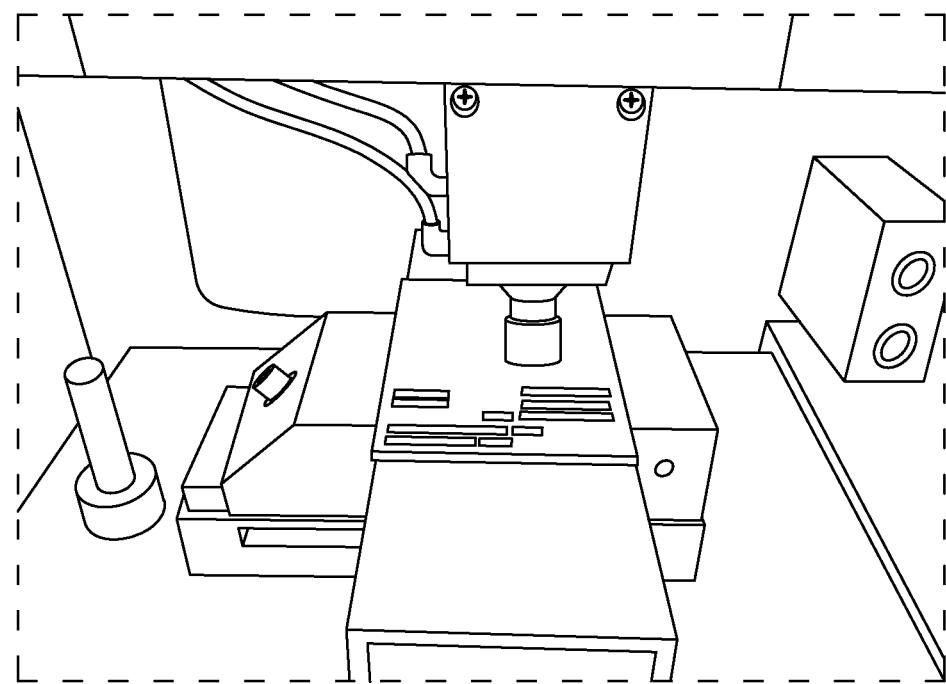
FIG. 45 shows a fabrication process.
Figure 45:
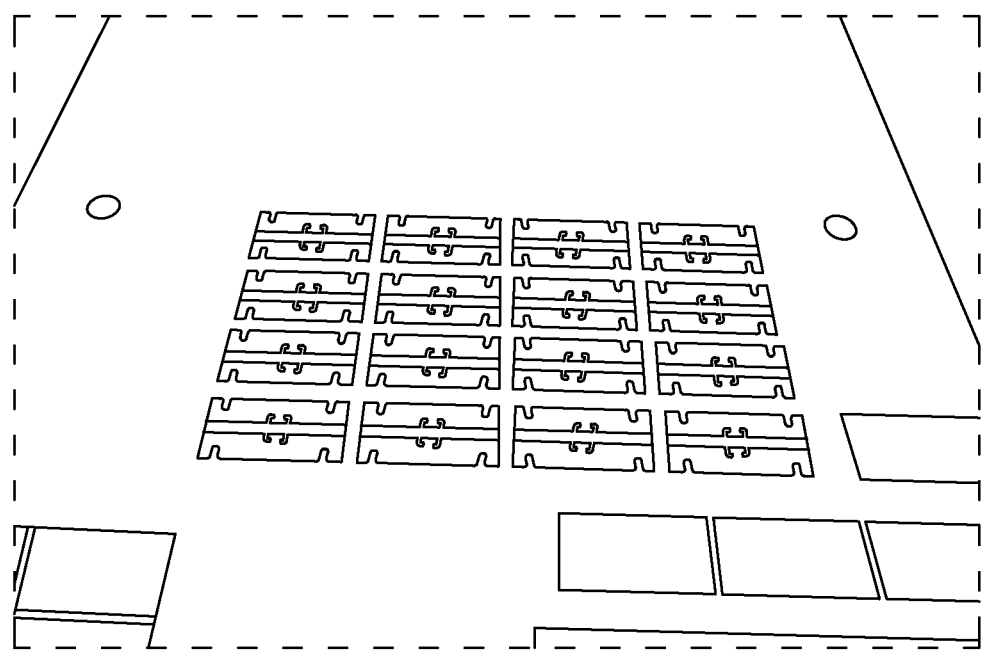

These parts can be fabricated fairly easily by milling them from copper clad board. One embodiment uses $\frac{1}{32}$" thick copper clad FR1 board with 1 oz (1.4 mil) double-sided copper. The Roland MDX-540 is an ideal tool for this job because the automatic tool-changer enables the use of rough and finish tools to deal with rapid tool wear. To do double sided milling, two registration holes are drilled through a board and the fixture plate. Then $\frac{1}{8}$" taper pins are used to position the board with high precision after flipping it over. FIG. 45 shows a fabrication process.

Testing

Figure 46:
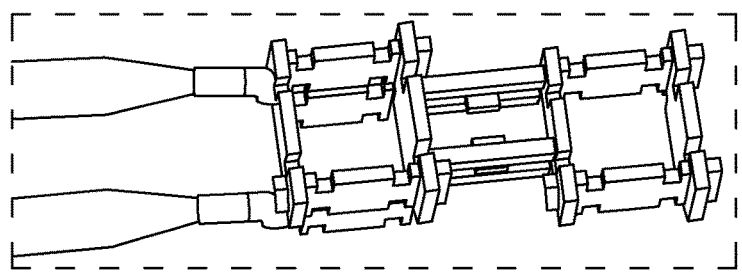
FIG. 46 shows continuity testing.

The continuity of the conductive joints was tested by constructing a simple LED assembly. Ground is supplied by the bottom half of the node, and power is supplied by the top half as shown in FIG. 46. Many LED's can be wired in parallel using this routing scheme.

Figure 47:
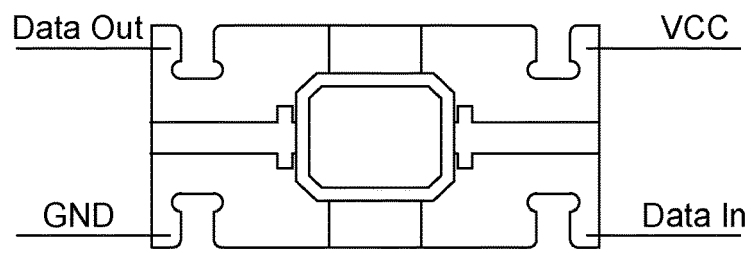
FIG. 47 shows a Neopixel part.

A more complex routing example is needed to route traces for Neopixel parts. An example of a circuit routing that can done with this assembly architecture involves the wiring of an array of Neopixel smart RGB LED's. Each neopixel has four connections: power, ground, data in, and data out as shown in FIG. 47. The power and ground are wired in parallel, while the data in and data out allows the neopixels to be chained serially.

Figure 48:
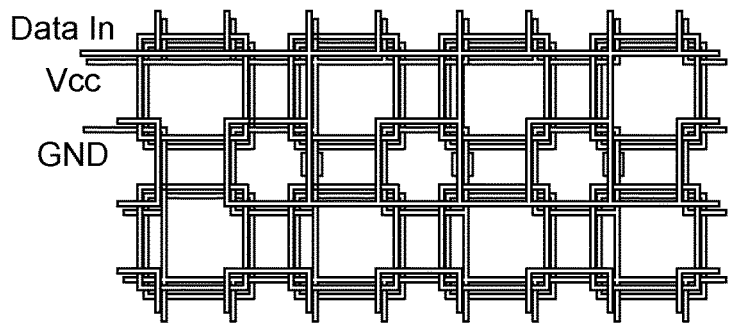
FIG. 48 shows wiring of Neopixels with crossover parts.
Figure 48:
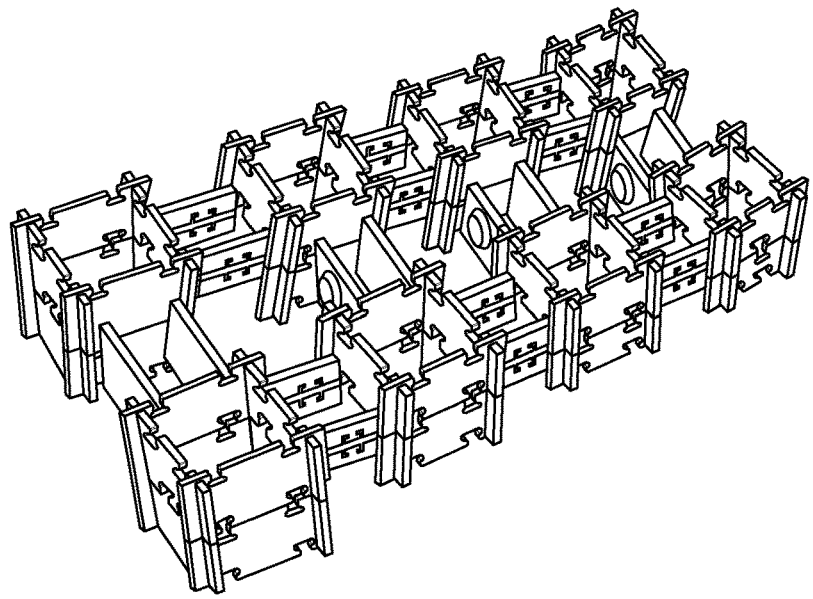

To route this example, the split-conductive node and split-conductive strut are needed. Additionally, a crossover strut is required in order to have a signal change layer in the structure as shown in FIG. 48. Here, signal wires that control three neopixels independently are routed through the structure. Power, ground, and a signal data input signal are supplied externally at one node of the structure, and the signals are routed based on the construction of the structure. FIGS. 49-51 show testing of the assembled circuit. The RGB LED's cycle through their colors one at a time.

Examples and illustrations have been presented that show features of the present invention and aid in understanding it. One skilled in the art will realize that numerous changes and variations are possible without departing from the spirit of the invention. Each of these changes and variations is within the scope of the present invention.

The invention claimed is:

1. A discrete assembly system comprising:
    a plurality of parts belonging to a finite number of types including node part and strut part, wherein the node part comprises a two dimensional structure with a top and a bottom, with strut-connecting slots along both top and bottom for receiving rigid connections to strut parts, wherein the strut part comprises a two dimensional structure with a top and a bottom, with node-connecting slots along both top and bottom for receiving rigid connections to node parts, the plurality of parts constructed to be joined with a common interface;
    wherein the node parts additionally comprise at least two node-assembly slots offset from respective edges of the two-dimensional structure and disposed only on the top of the node part, the node-assembly slots having larger length than the strut-connecting slots;
    wherein the parts, when joined, form a regular lattice structure; and
    wherein, the parts are configured to be assembled vertically to make nodes solely by interconnection of node-assembly slots, and wherein assembled nodes may be interconnected through connection of node parts with strut parts at strut-connecting slots, allowing a structure to be assembled one part at a time.

2. The system of claim 1 wherein the parts are fabricated at different length scales by a 2-dimensional manufacturing processes.

3. The system of claim 1 wherein the parts interlock, allowing loads to be distributed through a plurality of parallel load paths.

4. The system of claim 1 wherein nodes are assembled from four identical node parts, each with four slots, each slot constructed to rigidly connect to a strut part.

5. The system of claim 4 wherein struts are constructed from strut parts.

6. The system of claim 5 wherein a quasi-isotropic structure is assembled from a plurality of nodes and struts built in planes that can be linked to one-another.

7. The system of claim 6 wherein the struts change orientation offset by every two nodes.

8. The system of claim 5 wherein struts can be flexural struts that can be constructed from two-dimensional laminate parts or from folded laminate parts.

9. The system of claim 5 wherein struts can be formed from two-part types, one of high-permeability material and the other a mandrel upon which a coil is wound.

10. The system of claim 9 wherein the high permeability material is iron or steel which houses one or more magnets to form an E-coil.

11. The system of claim 2 wherein the structure is assembled in a millimeter, sub-millimeter or micro-scale.

12. The system of claim 8 wherein the flexural struts are constructed to have one, two or three degrees of freedom.

13. The system of claim 12 wherein the flexural struts are manufactured using with individual laminate manufactured layers individually machined and bonded together.

14. The system of claim 13 wherein the flexural struts are bonded together using flexible double-sided tape.

15. The system of claim 12 wherein a revolute joint is constructed using two 1-degree of freedom struts with two 2-degree of freedom struts.

16. The system of claim 15 wherein the revolute joint has two orthogonal revolute degrees of freedom.

17. A discrete assembly system comprising:
a plurality of parts belonging to a finite number of types including node part and strut part, wherein the node part comprises a two dimensional structure with a top and bottom, with strut-connecting slots along both top and bottom for receiving rigid connections to strut parts, wherein the strut part comprises a two dimensional structure with a top and bottom, with slots along both top and bottom for receiving rigid connections to node parts, the plurality of parts constructed to be joined with a common interface;
wherein the node parts additionally comprise at least two node-assembly slots offset from respective edges of the two-dimensional structure and disposed only on the top of the node part, the node-assembly slots having larger length than the strut-connecting slots;
wherein the parts, when joined, form a regular lattice structure;
wherein, the plurality of parts are configured to be assembled vertically to make nodes solely by interconnection of node-assembly slots, and wherein assembled nodes may be interconnected through connection of node parts with strut parts at strut-connecting slots, allowing a structure to be assembled one part at a time;
wherein the plurality of parts are fabricated at different length scales by 2-dimensional manufacturing processes;
wherein the plurality of parts interlock, allowing loads to be distributed through a plurality of parallel load paths; and
wherein the finite number of parts types comprises two parts types.

* * * * *